US009194544B2

(12) United States Patent
Ono et al.

(10) Patent No.: US 9,194,544 B2
(45) Date of Patent: Nov. 24, 2015

(54) LIGHT EMITTING DEVICE, ILLUMINATING APPARATUS, AND DISPLAY APPARATUS

(75) Inventors: Yasuhiro Ono, Osaka (JP); Makoto Masuda, Osaka (JP); Kenzo Ohkubo, Osaka (JP); Nobuhiro Shirai, Osaka (JP); Tetsushi Ito, Osaka (JP); Takasumi Wada, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 135 days.

(21) Appl. No.: 14/233,651

(22) PCT Filed: Jun. 1, 2012

(86) PCT No.: PCT/JP2012/064273
§ 371 (c)(1),
(2), (4) Date: Jan. 30, 2014

(87) PCT Pub. No.: WO2013/011752
PCT Pub. Date: Jan. 24, 2013

(65) Prior Publication Data
US 2014/0160733 A1    Jun. 12, 2014

(30) Foreign Application Priority Data

Jul. 20, 2011    (JP) ................. 2011-159427

(51) Int. Cl.
| | |
|---|---|
| F21V 7/00 | (2006.01) |
| F21K 99/00 | (2010.01) |
| H01L 33/58 | (2010.01) |
| H01L 33/60 | (2010.01) |
| G02F 1/1335 | (2006.01) |

(52) U.S. Cl.
CPC ............ *F21K 9/50* (2013.01); *G02F 1/133605* (2013.01); *G02F 1/133603* (2013.01); *G02F 2001/133607* (2013.01); *H01L 33/58* (2013.01); *H01L 33/60* (2013.01)

(58) Field of Classification Search
CPC ........... F21K 9/54; F21V 7/0008; F21V 7/48; F21V 7/05; F21V 7/09; G02F 1/13357; G02F 1/133605
USPC ............ 362/33, 97.1, 97.3, 235, 247, 296.01, 362/297, 298
See application file for complete search history.

(56) References Cited

U.S. PATENT DOCUMENTS

| | | |
|---|---|---|
| 2007/0024990 A1 | 2/2007 | Paek et al. |
| 2010/0027243 A1 | 2/2010 | Nakanishi |

FOREIGN PATENT DOCUMENTS

| | | |
|---|---|---|
| JP | 10-39300 A | 2/1998 |
| JP | 2002-344027 A | 11/2002 |
| JP | 2005-44661 A | 2/2005 |

(Continued)

*Primary Examiner* — Hargobind S Sawhney
(74) *Attorney, Agent, or Firm* — Birch, Stewart, Kolasch & Birch, LLP

(57) ABSTRACT

There are provided a light-emitting device, an illuminating apparatus, and a display apparatus in which, in order to apply light to an object to be illuminated with uniformity in light intensity, the quantity of light which is applied to a part of an edge of a to-be-illuminated region of the to-be-illuminated object located near a light-emitting section can be lessened. A backlight unit includes a printed substrate, a plurality of light-emitting sections each of which has a base support, an LED chip and a lens, and reflective members each of which is placed around the light-emitting section and has a first wall portion and a second wall portion.

21 Claims, 16 Drawing Sheets

(56) References Cited

FOREIGN PATENT DOCUMENTS

| JP | 2005-235581 A | 9/2005 |
| JP | 2006-124600 A | 5/2006 |
| JP | 2010-205698 A | 9/2010 |
| JP | 2010-238420 A | 10/2010 |
| JP | 2011-187172 A | 9/2011 |
| JP | 2011-203720 A | 10/2011 |

LIGHT EMITTING DEVICE, ILLUMINATING APPARATUS, AND DISPLAY APPARATUS

TECHNICAL FIELD

The present invention relates to a light-emitting device, an illuminating apparatus, and a display apparatus.

BACKGROUND ART

A display apparatus has a display panel. In the display panel, a liquid crystal is enclosed in between two transparent substrates, and, upon application of voltage, the orientations of liquid crystal molecules are changed with consequent variations in light transmittance, thereby permitting the display of a predetermined image or the like in an optical manner. In the display apparatus, since the liquid crystal is not a light emitter in itself, for example, the display panel of transmissive type has, at its back side, a backlight unit which is an illuminating device for applying light to the display panel using a light source such as a cold-cathode fluorescent tube (CCFL) or a light-emitting diode (LED).

Backlight units are classified into two categories, namely a direct-lighting type in which light sources such as cold-cathode fluorescent tubes or LEDs are arranged at the bottom for light emission, and an edge-lighting type in which light sources such as cold-cathode fluorescent tubes or LEDs are arranged at an edge portion of a transparent plate called a light guide plate, so that light can be directed forward, through printed dots or patterns formed at the back, from the edge of the light guide plate.

Although the LED has excellent characteristics, including lower power consumption, longer service life, and the capability of reduction in environmental burdens without the use of mercury, its use as a light source for a backlight unit has fallen behind because of its expensiveness, the fact that there had been no white-color LED prior to the invention of a blue-color LED, and its high directivity. However, in recent years, as white-color LEDs exhibiting high color rendition and high brightness spring into wide use for illumination application purposes, LEDs are becoming less expensive, and consequently, as a light source for a backlight unit, the shift from the cold-cathode fluorescent tube to the LED has picked up momentum.

LEDs have high directivity, wherefore a backlight unit of edge-lighting type has the advantage over a backlight unit of direct-lighting type from the standpoint of effecting light irradiation in a manner such that a display panel can exhibit uniform surface brightness in a planar direction. However, the edge-lighting type backlight unit poses the following problems: localized arrangement of light sources at the edge portion of the light guide plate results in concentration of heat generated by the light sources; and the size of the bezel portion of the display panel is inevitably increased. Furthermore, the edge-lighting type backlight unit is subjected to severe restrictions in terms of local dimming control which attracts attention as a control technique capable of display of high-quality images and energy saving, and is therefore incapable of split-region control that achieves production of high-quality displayed images and low power consumption as well.

In view of the foregoing, studies are going on to come up with a method whereby, even if a highly-directive LED is used as a light source in a direct-lighting type backlight unit having an advantage in its suitability for local dimming control, a display panel can be irradiated with light with uniformity in the brightness of the display panel in its planar direction. As a technology to achieve uniformity in brightness, for example, in Patent Literature 1, there is described an illuminating apparatus comprising: a box-shaped frame member which defines a single region to be illuminated in an object to be illuminated; a printed substrate disposed on the bottom surface of the frame member; and a light-emitting device surrounded by the frame member. The light-emitting device includes: a light-emitting element disposed on the printed substrate; a lens in which one part of light emitted from the light-emitting element passes through the upper surface thereof for its exit, and another part of the light passes through the side surface thereof for its exit; and a diffusely-reflecting sheet disposed in a location on the frame member other than the location where the printed substrate is mounted.

CITATION LIST

Patent Literature

Patent Literature 1: Japanese Unexamined Patent Publication JP-A 2010-238420

SUMMARY OF INVENTION

Technical Problem

The illuminating apparatus described in Patent Literature 1 is not constituted so that light emitted from the light-emitting element is directly applied to the display panel, but so that light emitted from the light-emitting element is diffused by the lens in a direction perpendicular to the optical axis of the lens and is then reflected from the surface of the reflecting sheet, whereby the reflected light is applied to the display panel, and this design makes it possible to render the intensity of illumination light uniform in the planar direction of the display panel.

However, in the illuminating apparatus described in Patent Literature 1, the box-shaped frame member is shaped in a square when viewed planarly in a direction of the optical axis of the lens, and the lens is placed in the middle of this square shape, wherefore the distance from a side of the square shape to the lens is shorter than the distance from a corner of the square shape to the lens. Accordingly, the quantity of light which reaches the reflecting sheet on a wall of the frame member located at the side of the square shape is greater than the quantity of light which reaches the reflecting sheet on a wall of the frame member located at the corner of the square shape, and correspondingly the quantity of light which is applied to a part of the display panel opposed to the side of the square shape is greater than the quantity of light which is applied to a part of the display panel opposed to the corner. That is, in the display panel, a part of the edge of its to-be-illuminated region located near the lens receives a larger quantity of illumination light than a part of the edge located away from the lens, which results in unevenness in the quantity of light applied to the display panel.

An object of the invention is to solve such a problem, and thus to provide a light-emitting device, an illuminating apparatus, and a display apparatus in which, in order to apply light to an object to be illuminated with uniformity in light intensity, the quantity of light which is applied to a part of an edge of a to-be-illuminated region of the to-be-illuminated object located near a light-emitting section can be lessened.

Solution to Problem

The invention provides a light-emitting device for applying light to an object to be illuminated, comprising:
 a light-emitting section for emitting light; and
 a reflective member disposed around the light-emitting section, the reflective member having a base portion extending in a direction perpendicular to an optical axis of the light-emitting section, and an inclined portion extending with inclination from the base portion, the inclined portion including a first wall portion and a second wall portion which is lower in height from the base portion than the first wall portion, and is shorter in distance from the light-emitting section than the first wall portion.

Moreover, the invention provides a light-emitting device for applying light to an object to be illuminated, comprising:
 a light-emitting section for emitting light; and
 a reflective member disposed around the light-emitting section, the reflective member having a base portion extending in a direction perpendicular to an optical axis of the light-emitting section, and an inclined portion extending with inclination from the base portion, the inclined portion including a first wall portion and a second wall portion which is smaller in angle of inclination relative to the base portion than the first wall portion, and is shorter in distance from the light-emitting section than the first wall portion.

Moreover, the invention provides a light-emitting device for applying light to an object to be illuminated, comprising:
 a light-emitting section for emitting light; and
 a reflective member disposed around the light-emitting section, the reflective member having a base portion extending in a direction perpendicular to an optical axis of the light-emitting section, and an inclined portion extending with inclination from the base portion, the inclined portion including a first wall portion and a second wall portion which is lower in height from the base portion than the first wall portion, is smaller in angle of inclination relative to the base portion than the first wall portion, and is shorter in distance from the light-emitting section than the first wall portion.

Moreover, in the invention, it is preferable that the first wall portion is disposed at a corner of the reflective member.

Moreover, in the invention, it is preferable that, when the reflective member is viewed in a direction parallel to the optical axis, an upper end of the first wall portion and an upper end of the second wall portion lie on the same straight line.

Moreover, in the invention, it is preferable that the first wall portion and the second wall portion are continuously connected to each other.

Moreover, the invention provides an illuminating apparatus comprising:
 a plurality of the light-emitting devices, the plurality of the light-emitting devices being disposed to align.

Moreover, the invention provides a display apparatus comprising:
 a display panel; and
 an illuminating apparatus that applies light to the display panel from a back side thereof, the illuminating apparatus including the light-emitting device.

Advantageous Effects of Invention

According to the invention, the second wall portion is lower in height from the base portion than the first wall portion, wherefore there is a decrease in the quantity of light applied to a part of an edge portion of a to-be-illuminated region of the to-be-illuminated object which faces the second wall portion. Since the second wall portion lies closer to the light-emitting section than the first wall portion, it is possible to lessen the quantity of light applied to a part of the edge portion of the to-be-illuminated region of the to-be-illuminated object which is situated closer to the light-emitting section.

According to the invention, the second wall portion is smaller in angle of inclination relative to the base portion than the first wall portion, wherefore there is a decrease in the quantity of light applied to a part of the edge portion of the to-be-illuminated region of the to-be-illuminated object which faces the second wall portion. Since the second wall portion lies closer to the light-emitting section than the first wall portion, it is possible to lessen the quantity of light applied to a part of the edge portion of the to-be-illuminated region of the to-be-illuminated object which is situated closer to the light-emitting section.

According to the invention, the second wall portion is lower in height from the base portion than the first wall portion, and is smaller in angle of inclination relative to the base portion than the first wall portion, wherefore there is a decrease in the quantity of light applied to a part of the edge portion of the to-be-illuminated region of the to-be-illuminated object which faces the second wall portion. Since the second wall portion lies closer to the light-emitting section than the first wall portion, it is possible to lessen the quantity of light applied to a part of the edge portion of the to-be-illuminated region of the to-be-illuminated object which is situated closer to the light-emitting section.

According to the invention, since the display panel can be irradiated with light by the illuminating apparatus equipped with the light-emitting device, it is possible to allow display of images of even higher quality.

BRIEF DESCRIPTION OF DRAWINGS

Other and further objects, features, and advantages of the invention will be more explicit from the following detailed description taken with reference to the drawings wherein.

DESCRIPTION OF EMBODIMENTS

Hereinafter, preferred embodiments of the invention will be described in detail with reference to the drawings.

Figure 1:
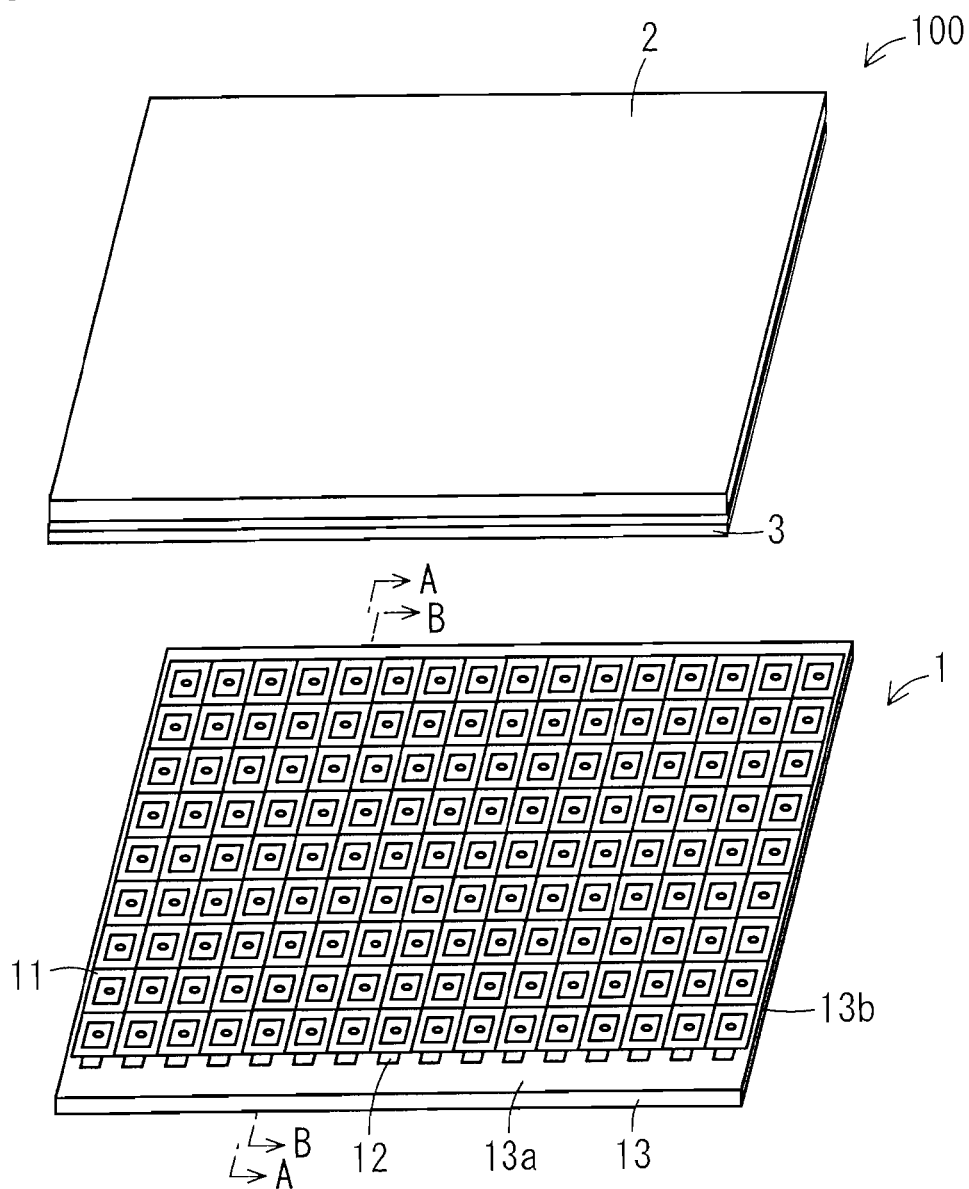
FIG. 1 is an exploded perspective view showing the structure of a liquid-crystal display apparatus.
Figure 2A:
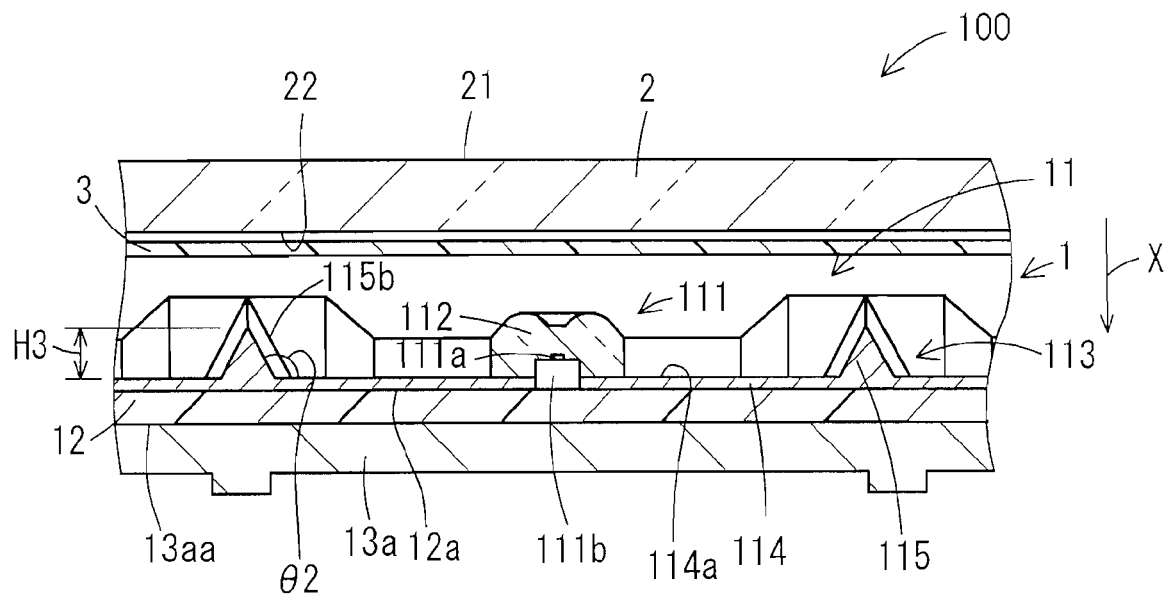
FIG. 2A is a view schematically showing part of the section of the liquid-crystal display apparatus taken along the line A-A of FIG. 1.
Figure 2B:
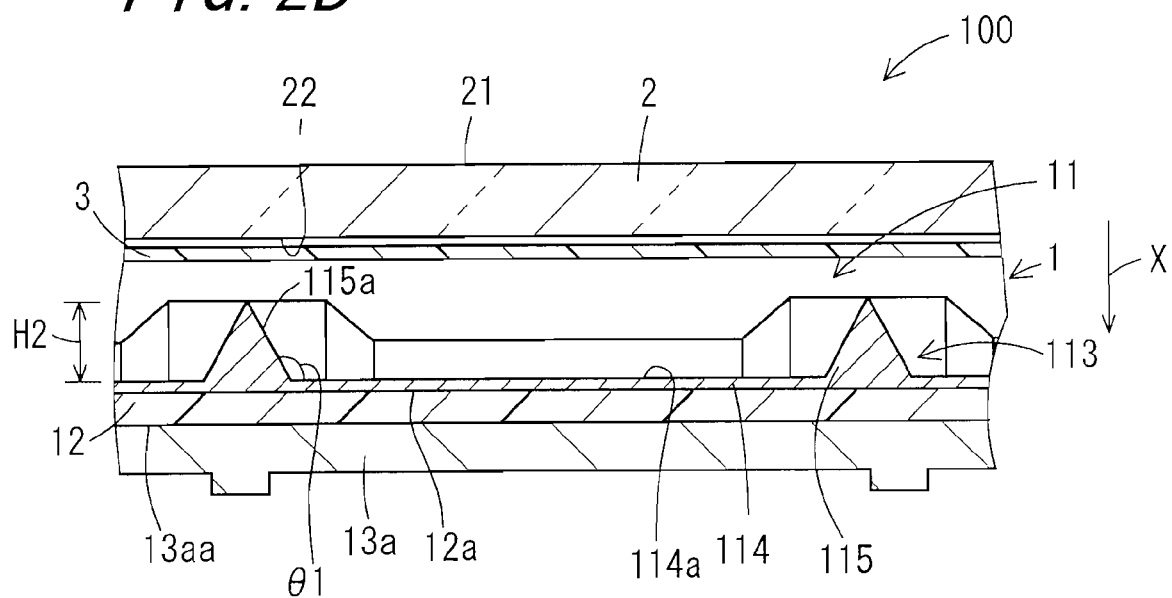
FIG. 2B is a view schematically showing part of the section of the liquid-crystal display apparatus taken along the line B-B of FIG. 1.

FIG. 1 is an exploded perspective view showing the structure of a liquid-crystal display apparatus 100 in accordance with a first embodiment of the invention. FIG. 2A is a view schematically showing part of the section of the liquid-crystal display apparatus 100 taken along the line A-A of FIG. 1. FIG. 2B is a view schematically showing part of the section of the liquid-crystal display apparatus 100 taken along the line B-B of FIG. 1. The liquid-crystal display apparatus 100 which is a display apparatus according to the invention is constituted for use in television sets, personal computers, and so forth, for showing an image on a display screen in response to output of image information. The display screen is constructed of a liquid-crystal panel 2 which is a transmissive display panel having a liquid-crystal element, and the liquid-crystal panel 2 has the form of a rectangular flat plate. In the liquid-crystal panel 2, two sides in a thickness-wise direction thereof will be referred to as a front side 21 and a back side 22, respectively. The liquid-crystal display apparatus 100 shows an image in a manner such that the image is viewable in a direction from the front side 21 to the back side 22.

The liquid-crystal display apparatus 100 comprises the liquid-crystal panel 2 and a backlight unit 1. The liquid-crystal panel 2 is supported on a sidewall portion 13b in parallel relation to a bottom surface 13aa of a bottom portion 13a of a frame member 13 provided in the backlight unit 1. The liquid-crystal panel 2 includes two substrates, and is shaped like a rectangular plate when viewed in the thickness-wise direction. The liquid-crystal panel 2 includes a switching element such as a TFT (thin film transistor), and liquid crystal is filled in a gap between the two substrates. The liquid-crystal panel 2 performs a display function through irradiation of light from the backlight unit 1 placed on the back side 22 as backlight. The two substrates are provided with a driver (source driver) for pixel driving control in the liquid-crystal panel 2, various elements and wiring lines.

Moreover, in the liquid-crystal display apparatus 100, a diffusion plate 3 is disposed between the liquid-crystal panel 2 and the backlight unit 1 so that both surfaces of the diffusion plate 3 are parallel to surfaces of the liquid-crystal panel 2 opposed to the diffusion plate 3. A prism sheet may be interposed between the liquid-crystal panel 2 and the diffusion plate 3.

The diffusion plate 3 diffuses light emitted from the backlight unit 1 in the planar direction to prevent localized brightness variations. The prism sheet controls a traveling direction of light that has reached there from the back side 22 through the diffusion plate 3 so that the light can be directed toward the front side 21. In the diffusion plate 3, to prevent lack of uniformity in brightness in the planar direction, the traveling direction of light involves, as vector components, many planar-directional components. On the other hand, in the prism sheet, the traveling direction of light involving many planar-directional vector components is converted into a traveling direction of light involving many thickness-directional components. Specifically, the prism sheet is formed by arranging a large number of lenses or prism-like portions in the planar direction, and this arrangement allows reduction in the degree of diffusion of light traveling in the thickness-wise direction. This makes it possible to enhance the brightness of the display in the liquid-crystal display apparatus 100.

The backlight unit 1 is a backlight device of direct-lighting type for applying light to the liquid-crystal panel 2 from the back side 22. The backlight unit 1 includes a plurality of light-emitting devices 11 for applying light to the liquid-crystal panel 2, a plurality of printed substrates 12, and the frame member 13.

The frame member 13 serves as a basic structure of the backlight unit 1, and is composed of the flat plate-shaped bottom portion 13a opposed to the liquid-crystal panel 2, with a predetermined spacing secured between them, and the sidewall portion 13b which is continuous with the bottom portion 13a so as to extend upright therefrom. The bottom portion 13a is rectangular-shaped when viewed in the thickness-wise direction, and its size is slightly larger than the size of the liquid-crystal panel 2. The sidewall portion 13b is formed so as to extend upright toward the front side 21 of the liquid-crystal panel 2 from each of two ends corresponding to the short sides of the bottom portion 13a and another two ends corresponding to the long sides thereof. Thus, four flat plate-shaped sidewall portions 13b are formed along the periphery of the bottom portion 13a.

The printed substrate 12 is fixed to the bottom surface 13aa of the bottom portion 13a of the frame member 13. On a mounting surface 12a of the printed substrate 12 are arranged a plurality of light-emitting sections 111 which will hereafter be described. The printed substrate 12 is a longitudinally-elongated member, and its length in a width-wise direction perpendicular to the longitudinal direction is set at 10 mm for example, and its length in a thickness-wise direction perpendicular to the longitudinal direction is set at 0.8 mm, for example. The two or more printed substrates 12 are juxtaposed in the width direction so as to be spaced 30 mm apart, for example. The printed substrate 12 is, for example, a glass epoxy-made substrate having an electrically-conductive layer formed on each side.

The printed substrate 12 extends to the sidewall portion 13b of the frame member 13 in the longitudinal direction. The sidewall portion 13b is provided with a connector for feeding electric power to the printed substrate 12, and, the printed substrate 12 is connected to the connector, so that electric power can be fed to each of the light-emitting devices 11 through the electrically-conductive layers disposed on the printed substrate 12.

A plurality of light-emitting devices 11 are devices for applying light to the liquid-crystal panel 2. In this embodiment, the plurality of light-emitting devices 11 are arranged in a group, and, a plurality of printed substrates 12 each having the plural light-emitting devices 11 are juxtaposed so as to face the entire area of the back side 22 of the liquid-crystal panel 2, with the diffusion plate 3 lying between them, thereby providing matrix arrangement of the light-emitting devices 11. That is, the plurality of light-emitting devices 11 are disposed to align. Each of the light-emitting devices 11 is disposed so as to have a square outer shape when viewed planarly in a direction perpendicular to the mounting surface 12a of the printed substrate 12, as well as in a direction from the printed substrate 12 to the bottom surface 13aa of the bottom portion 13a of a frame member 13 (hereafter referred to as "X direction"), and is disposed so that the light quantity level stands at 6000 cd/m² in a to-be-illuminated region on an object to be illuminated defined by each of the light-emitting devices 11. The length of a side of the square shape is set at 40 mm, for example.

Figure 3:
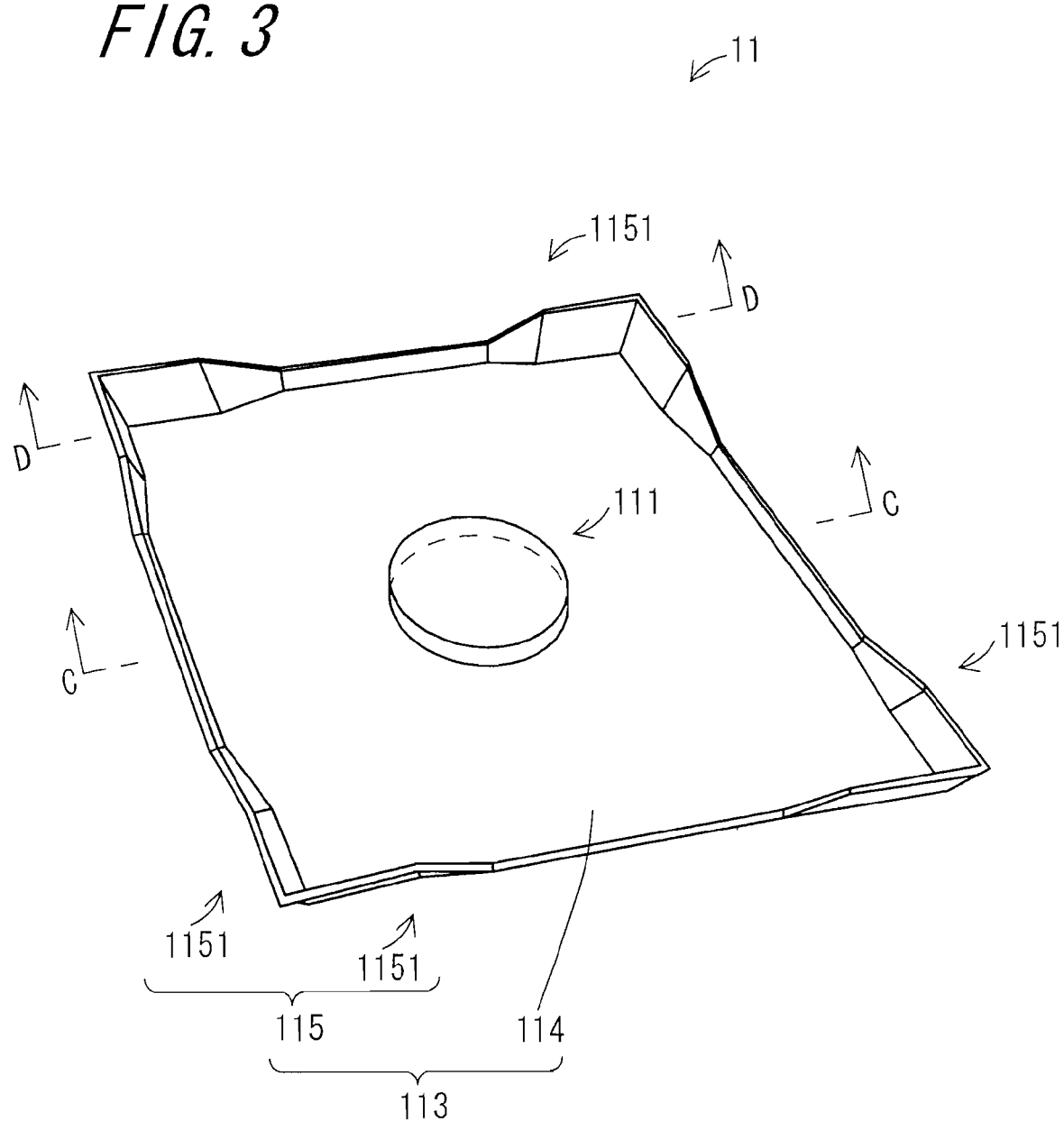
FIG. 3 is a view schematically showing outer appearance of a light-emitting device including a reflective member and a light-emitting section.

Each of the plurality of light-emitting devices 11 comprises a light-emitting section 111, and a reflective member 113 placed around the light-emitting section 111, for reflecting light emitted from the light-emitting section 111. In FIG. 3, there is schematically shown outer appearance of the light-emitting device 11. The section of the light-emitting device 11 taken along the line C-C of FIG. 3 conforms to FIG. 2A, and the section of the light-emitting device 11 taken along the line D-D of FIG. 3 conforms to FIG. 2B.

The light-emitting section 111 includes a light-emitting diode (LED) chip 111a which is a light-emitting element, a base support 111b for supporting the LED chip 111a, and a lens 112.

Figure 4:
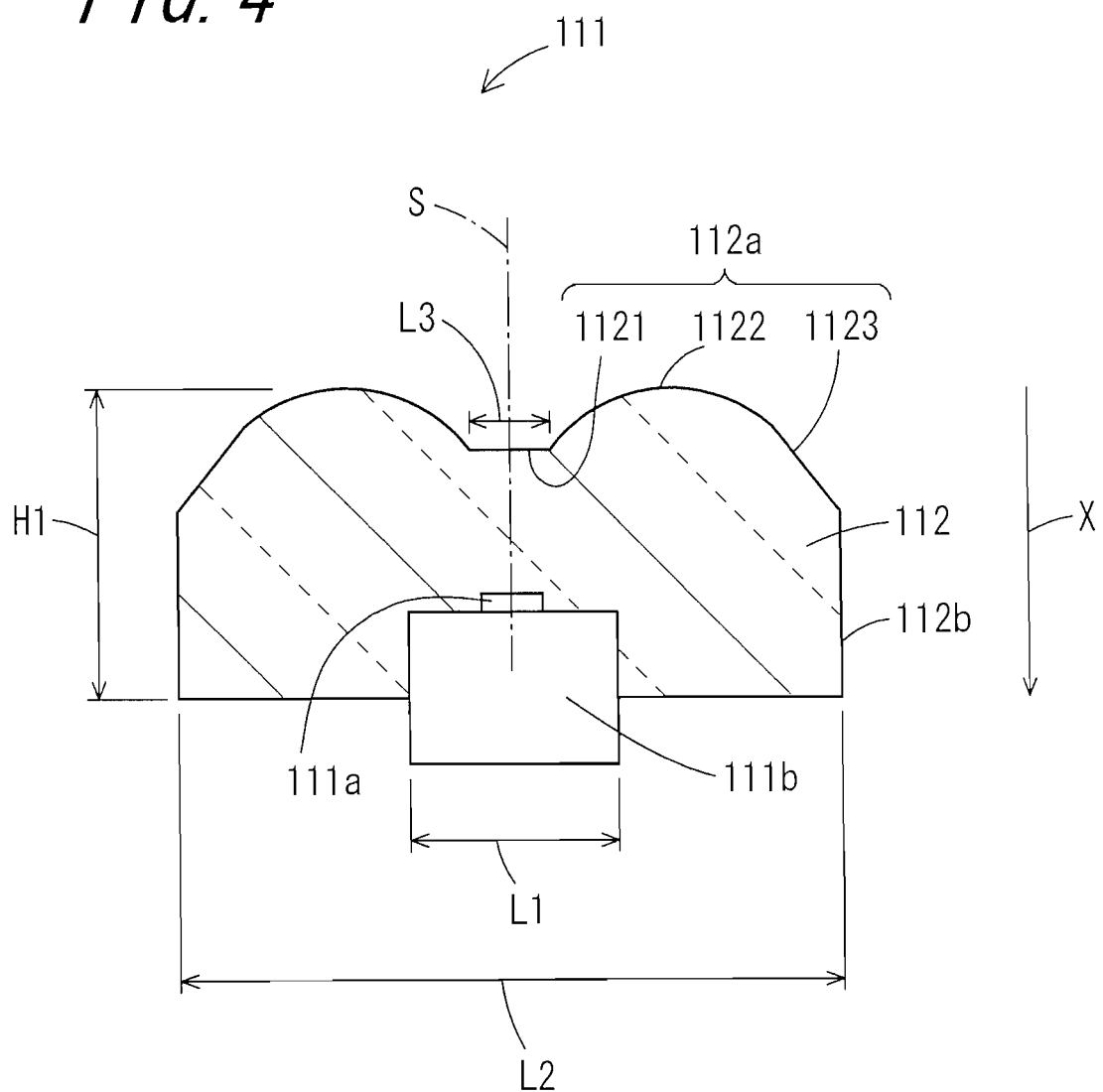
FIG. 4 is a view showing an LED chip supported by a base support and a lens.

FIG. 4 is a view showing the LED chip 111a supported by the base support 111b, and the lens 112. The base support 111b is a member for supporting the LED chip 111a, which is made of resin. In the base support 111b, its support surface for supporting the LED chip 111a is shaped in a square when viewed planarly in the X direction, and a length L1 of a side of the square shape is set at 3 mm, for example. Moreover, the height of the base support 111b in the X direction is set at 1 mm, for example.

The LED chip 111a is mounted on the printed substrate 12, with the base support 111b lying between them, for emitting light in a direction away from the printed substrate 12. The direction of an optical axis S of the LED chip 111a is parallel to the X direction. When the light-emitting device 11 is planarly viewed in the X direction, the LED chip 111a is located centrally of the base support 111b. In the plurality of light-emitting devices 11, their LED chips 111a can be controlled on an individual basis in respect of light emission. This allows the backlight unit 1 to perform local dimming control.

The lens 112, which is disposed in contact with the base support 111b so as to cover the LED chip 111a and the base support 111b supporting the LED chip 111a, allows light emitted from the LED chip 111a to undergo reflection or refraction in a plurality of directions intersected by the optical axis S of the LED chip 111a. The lens 112 is a transparent lens made of acrylic resin, for example.

In the lens 112, its top surface 112a facing the liquid-crystal panel 2 is curved, with a recess formed centrally thereof. Moreover, its side surface 112b is defined by the periphery of a cylindrical column whose axis coincides with the optical axis S of the LED chip 111a.

The lens 112 is configured rotationally symmetrically about the optical axis S. In the lens 112, a diameter L2 of its section perpendicular to the optical axis S is set at 10 mm, for example. The lens 112 extends outward relative to the base support 111b. That is, the lens 112 is larger than the base support 111b with respect to a direction perpendicular to the optical axis S of the LED chip 111a (the diameter L2 of the lens 112 is greater than the length L1 of one side of the support surface of the base support 111b). In this way, since the lens 112 extends outward relative to the base support 111b, it is possible to diffuse light emitted from the LED chip 111a over an even wider range by the lens 112. Moreover, a height H1 of the lens 112 is set at 4.5 mm, for example, which is smaller than the diameter L2. That is, the lens 112 is so configured that the maximum length in a direction perpendicular to the optical axis S of the LED chip 111a is greater than the height H1.

The top surface 112a of the lens 112 includes: a central portion 1121 which faces the LED chip 111a and is parallel to each side of the diffusion plate 3; a first curved portion 1122 surrounding the central portion 1121; and a second curved portion 1123 surrounding the first curved portion 1122. At the surface of the lens 112, the central portion 1121 and the second curved portion 1123 of the top surface 112a, as well as the side surface 112b, serve as transmitting regions for effecting transmission of light which has been emitted from the LED chip 111a and then reached the lens 112 through its interior. On the other hand, the first curved portion 1122 of the top surface 112a serves as a reflecting region for reflecting the light which has been emitted from the LED chip 111a and then reached the lens 112 through its interior toward the side surface 112b. In this embodiment, the lens 112 is contacted on its bottom surface by a base portion 114 of the reflective member 113, thereby preventing the exit of light from the bottom surface.

The central portion 1121 of the top surface 112a is formed in the middle of the top surface 112a opposed to the liquid-crystal panel 2, and the center of the central portion 1121 (viz., the optical axis of the lens 112) is located on the optical axis S of the LED chip 111a. The central portion 1121 of the top surface 112a is in parallel with the light-emitting surface of the LED chip 111a and is shaped in a circle, and a diameter L3 of the circular shape is set at 1 mm, for example.

The first curved portion 1122 of the top surface 112a is an annular curved surface which merges with the outer edge of the central portion 1121, and extends in one of the directions along the optical axis S of the LED chip 111a (the direction toward the liquid-crystal panel 2) as it extends outward, while being curved in convex form inwardly in the one optical-axis S direction. The first curved portion 1122 of the top surface 112a is made as a reflecting region, and thus its curve is constituted to permit total reflection of light emitted from the LED chip 111a.

The second curved portion 1123 of the top surface 112a is an annular curved surface which merges with the outer edge of the first curved portion 1122, and extends in the other of the directions along the optical axis S of the LED chip 111a (the direction away from the liquid-crystal panel 2) as it extends outward, while being curved in convex form outwardly in the one optical-axis S direction.

In this embodiment, the LED chip 111a and the lens 112 are formed in precise alignment with each other so that the lens 112 is placed in contact with the LED chip 111a, with its center (viz., the optical axis of the lens 112) located on the optical axis S of the LED chip 111a. As the technique of forming the LED chip 111a and the lens 112 in alignment in advance, a few ways will be considered, i.e. insert molding, and a method of fitting the LED chip 111a supported on the base support 111b in the lens 112 molded in a predetermined shape. In this embodiment, the LED chip 111a and the lens 112 are formed in alignment with each other in advance by insert molding.

Molds used for insert molding are broadly classified as an upper mold and a lower mold. A resin used as the raw material of the lens 112 is poured, through a resin inlet, into a space created by combining the upper mold and the lower mold, while retaining the LED chip 111a. Alternatively, the molding process may be carried out by pouring a resin used as the raw material of the lens 112 into a space created by combining the upper mold and the lower mold through a resin inlet, while retaining the LED chip 111a supported on the base support 111b. By forming the LED chip 111a and the lens 112 by means of insert molding in that way, it is possible to ensure precise alignment between the lens 112 and the LED chip 111a so that the lens 112 can be contacted by the LED chip 111a. Thus, the backlight unit 1 becomes capable of reflection and refraction of light emitted from the LED chip 111a with high accuracy by the action of the lens 112, and accordingly, even in the low-profile liquid-crystal display apparatus 100 in which the distance from the diffusion plate 3 to the printed substrate 12 is short, the liquid-crystal panel 2 can be irradiated with light with uniformity in light intensity in the planar direction.

Figure 5:
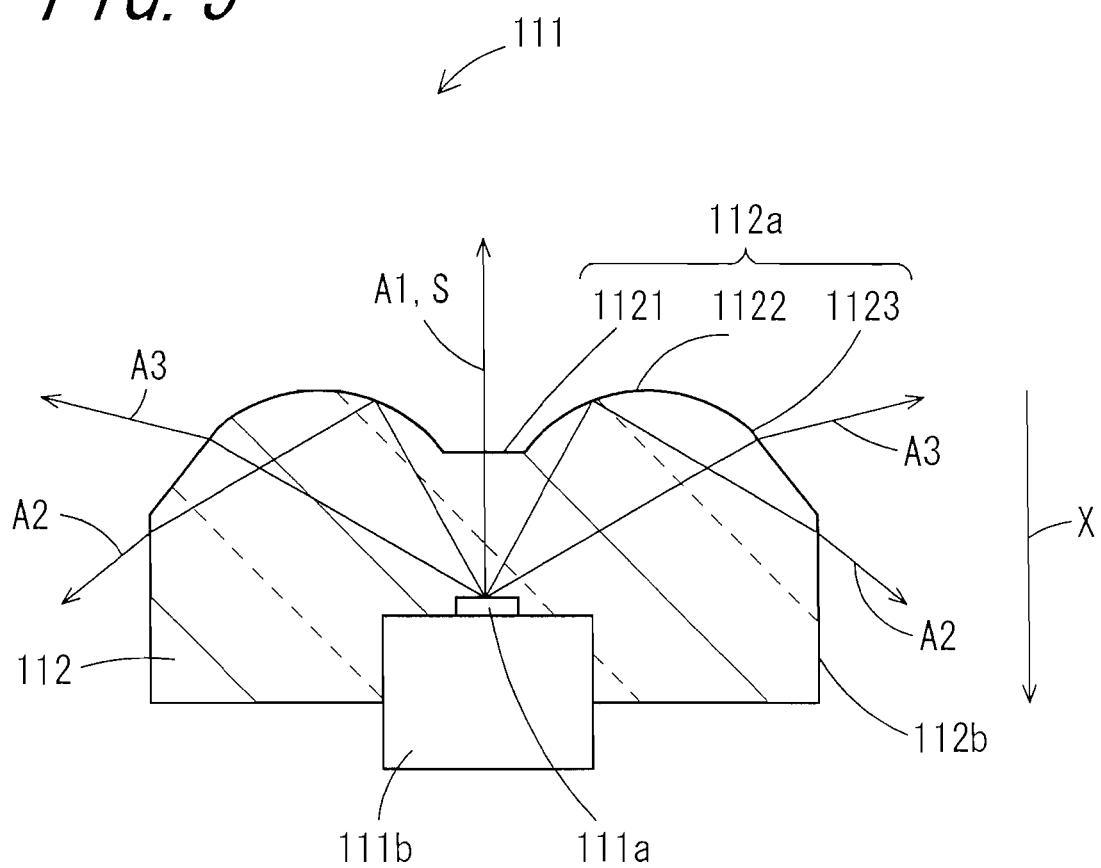
FIG. 5 is a view for explaining an optical path of light emitted from the LED chip.

FIG. 5 is a view for explaining an optical path of light emitted from the LED chip 111a. Light emitted from the LED chip 111a enters the lens 112, and is then diffused by the lens 112. Specifically, out of light incident on the lens 112, light which has reached the central portion 1121 at the top surface 112a opposed to the diffusion plate 3, which is an object to be illuminated, is caused to exit in a direction such as a direction indicated by an arrow A1 for its travel toward the diffusion plate 3. The light which has passed through the central portion 1121 is directly applied to the diffusion plate 3.

Moreover, as shown in FIG. 5, light which has reached the first curved portion 1122 is totally reflected from the first curved portion 1122 for its travel toward the side surface 112b, and then exits in a direction such as a direction indicated by an arrow A2 from the side surface 112b. Upon exiting in a direction such as the arrow A2-indicated direction, the light reaches the reflective member 113 placed around the lens 112, and is reflected from the reflective member 113 so that it can be applied to the diffusion plate 3 which is the to-be-illuminated object. Light which has reached the second curved portion 1123 is refracted, and then exits in a direction such as a direction indicated by an arrow A3 for its travel toward the diffusion plate 3.

Figure 6:
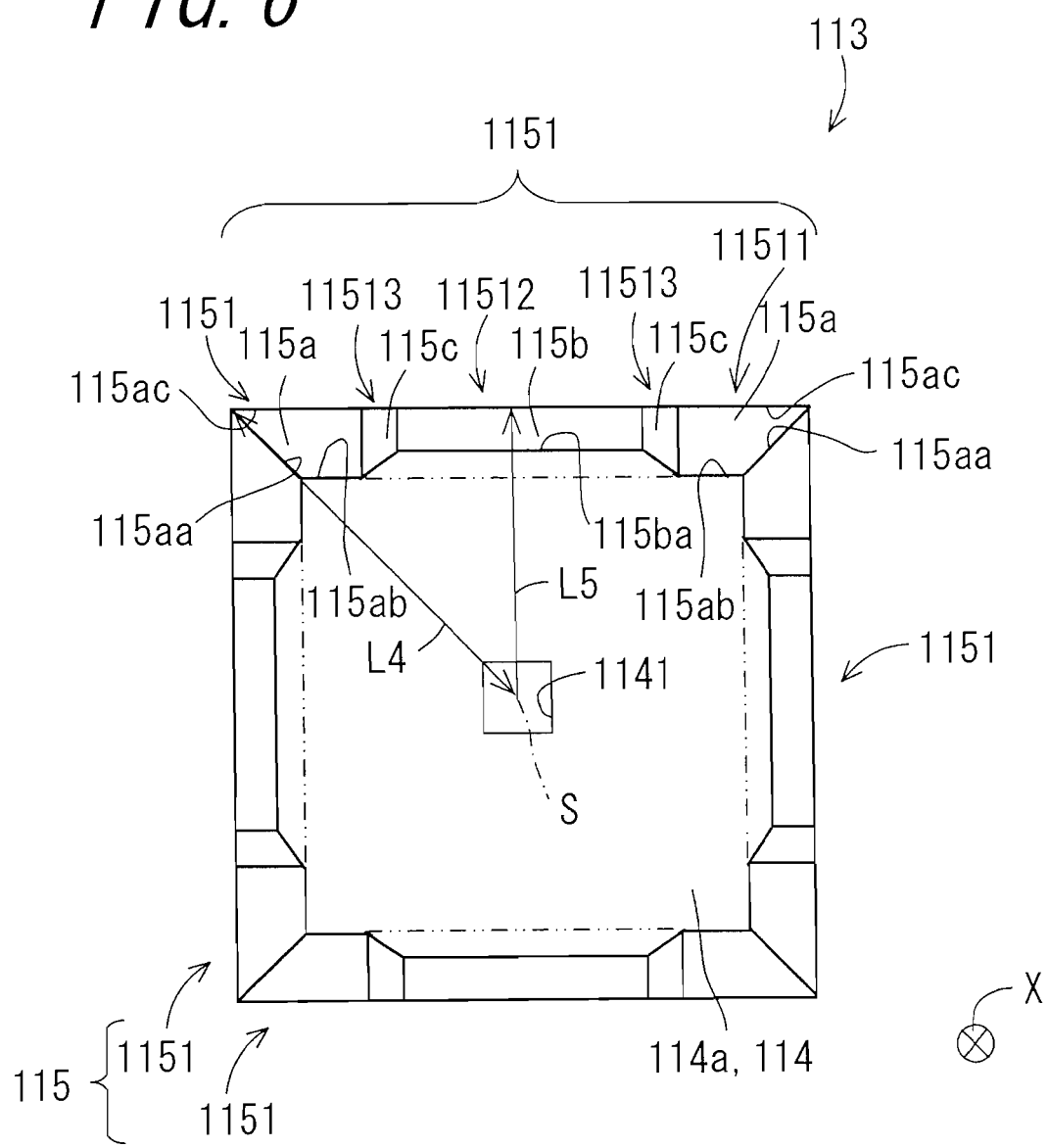
FIG. 6 is a view showing the reflective member as viewed planarly in an X direction.

Next, the reflective member 113 will be explained with reference to FIGS. 2A, 2B, 3 and 6. FIG. 6 is a view showing the reflective member 113 as viewed planarly in the X direction. The reflective member 113 is configured to have a square outer shape when viewed planarly in the X direction. Each side of the square shape is parallel to the directions of rows or columns of the matrix arrangement of a plurality of LED chips 111a. In this embodiment, the reflective member 113 is configured linearly symmetrically with respect to the diagonal line of the square shape. Also, the reflective member 113 is configured rotationally symmetrically through 90° about the center point of the square shape. By way of another embodiment of the invention, the reflective member 113 may be configured to have a rectangular outer shape when viewed planarly in the X direction.

The reflective member 113 comprises a base portion 114 disposed on the mounting surface 12a of the printed substrate 12, and an inclined portion 115 which surrounds the outer edge of the base portion 114 while being connected to the outer edge. The base portion 114, which is an icosagonal flat plate-shaped member having a centrally-located opening 1141, includes a first reflecting surface 114a defined by a plane which is perpendicular to the X direction and faces the diffusion plate 3. The inclined portion 115, which is a frame-like member surrounding the light-emitting section 111, includes a second reflecting surface 115a, a third reflecting surface 115b, and a fourth reflecting surface 115c. The second reflecting surface 115a, the third reflecting surface 115b, and the fourth reflecting surface 115c are each a plane which faces the light-emitting section 111, and is inclined in a manner such that it gradually separates from the printed substrate 12 in a direction opposite to the X direction with decreasing proximity to the light-emitting section 111 in a direction perpendicular to the X direction.

In the base portion 114, the first reflecting surface 114a serves as its main surface, and the square opening 1141 is formed in the middle thereof as viewed planarly in the X direction. The length of one side of the square opening 1141 is substantially equal to the length L1 of one side of the base support 111b for supporting the LED chip 111a, so that the base support 111b is insertable through the opening 1141. The first reflecting surface 114a of the base portion 114 has an icosagonal outer shape obtained by connecting an isosceles trapezoid to the central part of each side of a square shape. In this embodiment, the length of one side of the square shape is 38.2 mm, and, of two opposed parallel sides of the isosceles trapezoid, the longer one is disposed in entirely overlapping relation to the central part of each side of the square shape. Out of the two parallel sides of the isosceles trapezoid, the long side has a length of 22.2 mm, for example, whereas the short side has a length of 16 mm, for example, and, the distance between the long side and the short side is 0.37 mm, for example. Moreover, in this embodiment, each side of the square shape as above described is perpendicular or parallel to each side of the square defining the outer shape of the reflective member 113 as viewed planarly in the X direction.

The inclined portion 115 is a frame-like member constructed by connecting the ends of, respectively, four identically-shaped wall members 1151. Each of the wall members 1151 is composed of a first wall portion 11511 located at each end of the wall member 1151, a second wall portion 11512 located centrally of the wall member 1151, and a connection portion 11513 for connecting the first wall portion 11511 with the second wall portion 11512.

The first wall portion 11511, which is a flat plate-shaped member having the second reflecting surface 115a as a main surface, corresponds to the corner of the square defining the outer shape of the reflective member 113 as viewed planarly in the X direction. The second reflecting surface 115a is given a trapezoidal shape having two parallel sides, one side perpendicular to the two sides, and an oblique side 115aa opposed to the one side. The oblique side 115aa of the first wall portion 11511 is disposed in entirely overlapping relation to the oblique side 115aa of the first wall portion 11511 of other wall member 1151 than the wall member 1151 having the aforementioned first wall portion 11511.

Out of the two parallel sides of the trapezoidal second reflecting surface 115a, the shorter one, namely a short side 115ab is disposed in entirely overlapping relation to one side of the icosagonal first reflecting surface 114a. The length of the short side 115ab is set at 8 mm, for example. Moreover, of the two parallel sides of the trapezoidal second reflecting surface 115a, the longer one, namely a long side 115ac has a length of 8.9 mm, for example. A distance L4 from the optical axis S of the LED chip 111a to, of points lying on the long side 115ac, the point situated farthest from the optical axis S, is set at 27 mm, for example.

As shown in FIG. 2B, a height H2 of the second reflecting surface 115a with respect to the first reflecting surface 114a, more specifically, a distance H2 between the first reflecting surface 114a and the upper end of the second reflecting surface 115a in the X direction, is set at 5 mm, for example. Moreover, as shown in FIG. 2B, an angle of inclination θ1 of the second reflecting surface 115a relative to the first reflecting surface 114a is set at 100°, for example.

The second wall portion 11512, which is a flat plate-shaped member having the third reflecting surface 115b as a main surface, corresponds to the side, excluding the corner, of the square defining the outer shape of the reflective member 113 as viewed planarly in the X direction. The third reflecting surface 115*b* is given a rectangular shape, one side 115*ba* of which is disposed in entirely overlapping relation to one side of the icosagonal first reflecting surface 114*a*. The length of the one side 115*ba* of the third reflecting surface 115*b* in overlapping relation to one side of the first reflecting surface 114*a* is set at 16 mm, for example. A distance L5 from the optical axis S of the LED chip 111*a* to, of points lying on that side of the rectangular third reflecting surface 115*b* opposed to the one side 115*ba*, the point situated closest to the optical axis S, is set at 19.1 mm, for example, which is shorter than the distance L4.

As shown in FIG. 2A, a height H3 of the third reflecting surface 115*b* with respect to the first reflecting surface 114*a* is set at 3 mm, for example, which is lower than the height H2. Moreover, as shown in FIG. 2A, an angle of inclination θ2 of the third reflecting surface 115*b* relative to the first reflecting surface 114*a* is set at 100°, for example, which is equal to the inclination angle θ1.

The connection portion 11513 is a flat plate-shaped member having the fourth reflecting surface 115*c* as a main surface. The fourth reflecting surface 115*c* is given a quadrangular shape, and, of its four sides, three sides are disposed in overlapping relation to one side of the icosagonal first reflecting surface 114*a*, one side of the trapezoidal second reflecting surface 115*a*, and one side of the rectangular third reflecting surface 115*b*, respectively. The fourth reflecting surface 115*c* is so shaped that its height with respect to the first reflecting surface 114*a* becomes lower gradually from the second reflecting surface 115*a*-side to the third reflecting surface 115*b*-side. In this embodiment, the height of the fourth reflecting surface 115*c* with respect to the first reflecting surface 114*a* decreases gradually from 5 mm to 3 mm in a direction from the second reflecting surface 115*a* to the third reflecting surface 115*b*. As shown in FIG. 6, when the reflective member 113 is viewed in a direction parallel to the optical axis S, viz., the X direction, the upper end of the first wall portion 11511, the upper end of the second wall portion 11512, and the upper end of the connection portion 11513 lie on the same straight line. That is, so long as the reflective member 113 is viewed in a direction parallel to the optical axis S, viz., the X direction, the upper end of the first wall portion 11511 and the upper end of the second wall portion 11512 lie on the same straight line.

The base portion 114 and the inclined portion 115 are made of high-luminance PET (Polyethylene Terephthalate), aluminum, or the like. The high-luminance PET is foamed PET containing a fluorescent agent, and examples thereof include E60V (product name) manufactured by TORAY Industries, Inc. The base portion 114 and the inclined portion 115 have a thickness in a range of 0.1 to 0.5 mm, for example.

In this embodiment, the first reflecting surface 114*a* of the base portion 114, as well as the second reflecting surface 115*a*, the third reflecting surface 115*b*, and the fourth reflecting surface 115*c* of the inclined portion 115, exhibits a total reflectivity of 94%. The total reflectivity of each of these surfaces is greater than or equal to 90%, or preferably 100%. As specified in JIS H 0201:1998, total reflectivity refers to the sum of specular reflectivity and diffuse reflectivity, and its measurement can be conducted in conformity to JIS K 7375.

It is preferable that the base portion 114 and the inclined portion 115 constituting the reflective member 113 are formed integrally with each other, and also that the reflective members 113 provided respectively in the plurality of light-emitting devices 11 are formed integrally with each other. As the method of integrally forming a plurality of reflective members 113, where the reflective member 113 is made of foamed PET, extrusion molding can be adopted, and, where the reflective member 113 is made of aluminum, press working can be adopted. By integrally forming the reflective members 113 respectively provided in the plurality of light-emitting devices 11, it is possible to improve the accuracy of placement positions of the plurality of light-emitting devices 11 relative to the printed substrate 12, as well as to reduce the number of process steps required for installation of the reflective members 113 during assembly of the backlight unit 1, with a consequent increase in the efficiency of assembly operation.

In the backlight unit 1 thusly constructed, as described previously, the distance L5 is shorter than the distance L4. That is, the second wall portion 11512 lies closer to the light-emitting section 111 than the first wall portion 11511. Moreover, the height H3 of the third reflecting surface 115*b* is lower than the height H2 of the second reflecting surface 115*a*. That is, the second wall portion 11512 is made lower than the first wall portion 11511. The advantageous effects of the invention produced by the reduction of the height of the second wall portion 11512 will be described with reference to FIGS. 7 and 8.

Figure 7:
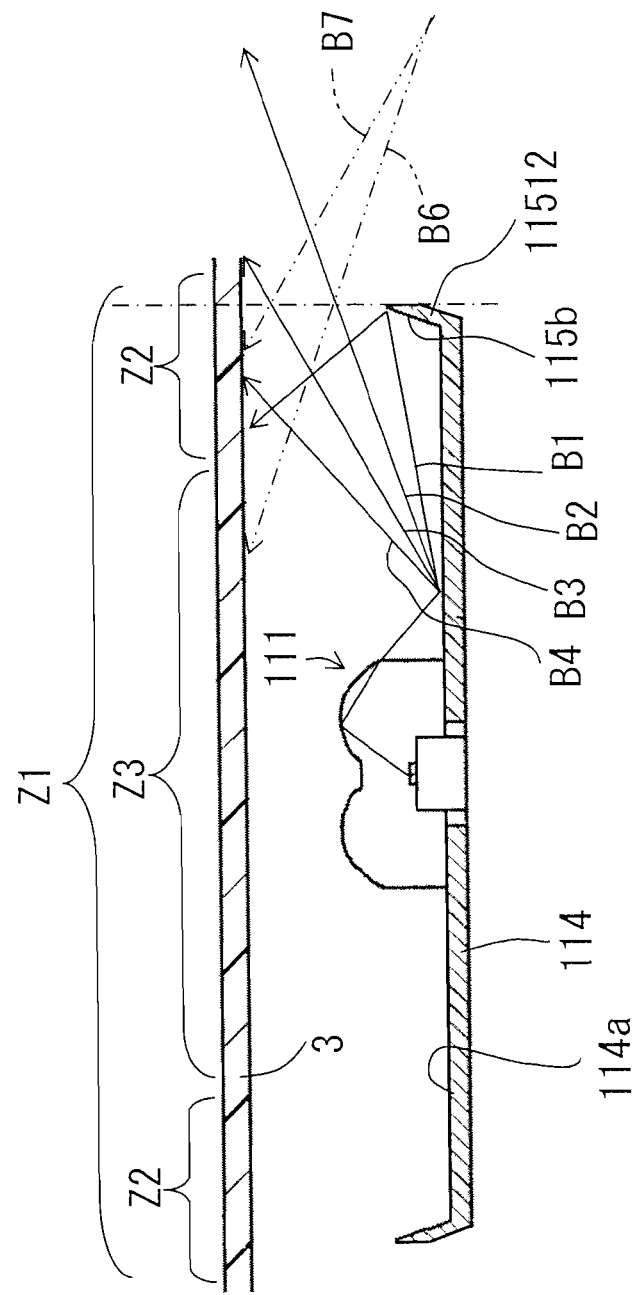
FIG. 7 is a view corresponding to FIG. 2A, illustrating advantageous effects of the invention.
Figure 8:
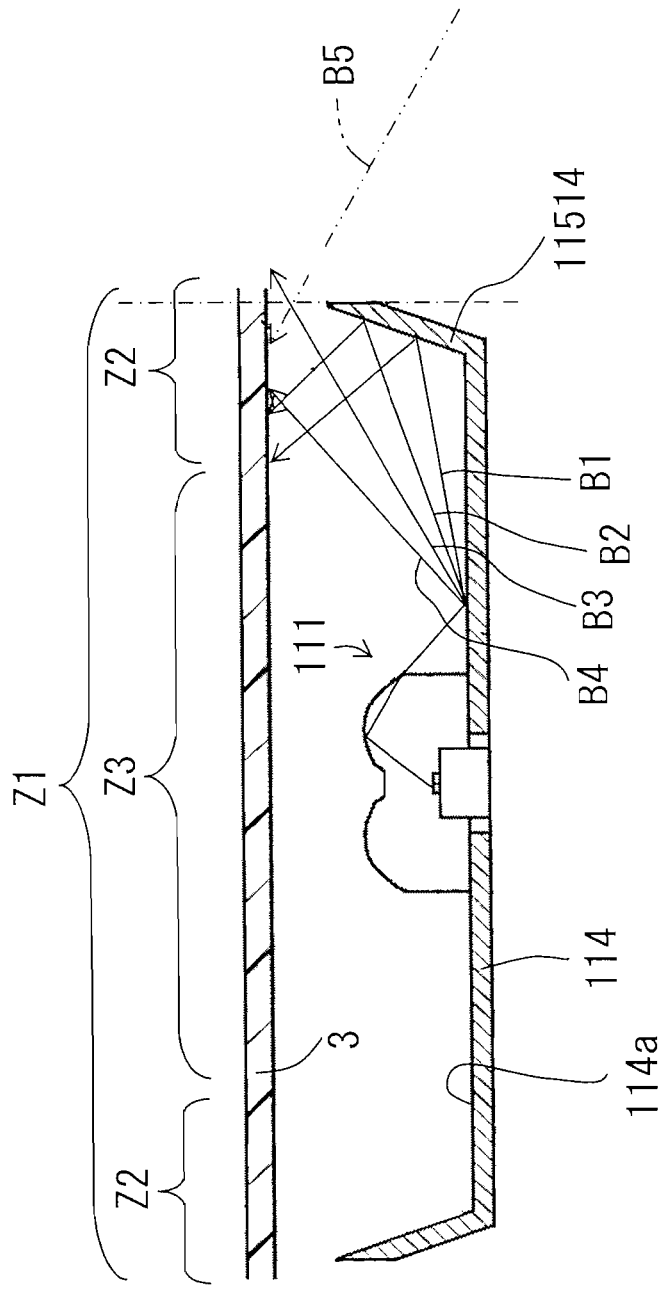
FIG. 8 is a view showing another example of a second wall.

FIG. 7, which shows the invention, corresponds to FIG. 2A. In FIG. 8, there is shown a case where, instead of the second wall portion 11512, a second wall portion 11514 is provided that is obtained by changing the height of the second wall portion 11512 so that the height becomes equal to the height of the first wall portion 11511. As shown in FIGS. 7 and 8, part of light emitted from the light-emitting section 111 travels toward the base portion 114 of the reflective member 113, and is then diffusely reflected from the first reflecting surface 114*a* of the base portion 114. At this time, the reflected light resulting from the diffuse reflection, for example, like reflected light B1 to B4, travels in a plurality of directions.

In the example shown in FIG. 8, the reflected light B1, B2 is reflected from the second wall portion 11514, and is then incident on an edge portion Z2 of a to-be-illuminated region Z1 which is the region of the diffusion plate 3 acting as the to-be-illuminated object defined by the reflective member 113. The reflected light B3 passes through a region above the second wall portion 11514 to go out of the to-be-illuminated region Z1, and, in return, reflected light B5 from another adjacent light-emitting device 11 is incident on the edge portion Z2 of the to-be-illuminated region Z1. The reflected light B4 travels directly to enter the edge portion Z2 of the to-be-illuminated region Z1.

In the example shown in FIG. 7, the reflected light B1 is, just as with the example shown in FIG. 8, incident on the edge portion Z2 of the to-be-illuminated region Z1. The reflected light B2, in contrast to the example shown in FIG. 8, passes through a region above the second wall portion 11512 to go out of the to-be-illuminated region Z1 due to the fact that the second wall portion 11512 is lower in height, and, in return, reflected light B6 from another adjacent light-emitting device 11 is incident on a middle portion Z3 of the to-be-illuminated region Z1. The reflected light B3 passes through a region above the second wall portion 11512 to go out of the to-be-illuminated region Z1, and, in return, reflected light B7 from another adjacent light-emitting device 11 is incident on the edge portion Z2 of the to-be-illuminated region Z1. The reflected light B4 travels directly to enter the edge portion Z2 of the to-be-illuminated region Z1.

Accordingly, as compared with the example shown in FIG. 8 where the second wall portion 11514 is identical in height with the first wall portion 11511, in the example shown in FIG. 7 where the second wall portion 11512 is lower in height than the first wall portion 11511, the quantity of light incident on a part of the edge portion Z2 of the to-be-illuminated region Z1 opposed to the second wall portion 11512 (a part thereof situated close to the second wall portion 11512) decreases. That is, it is possible to lessen the quantity of light applied to a part of the edge portion Z2 of the to-be-illuminated region Z1 opposed to the second wall portion 11512 (a part thereof situated close to the light-emitting section 111), and thereby render the quantity of light applied thereto uniform with the quantity of light applied to a part of the edge portion Z2 of the to-be-illuminated region Z1 opposed to the first wall portion 11511 (a part thereof situated away from the light-emitting section 111).

Although, in the first embodiment, the outer shape of the reflective member 113 as viewed planarly in the X direction is defined by a square which is 40 mm on a side, the length of one side of the square can be arbitrarily adjusted within the range of 25 mm to 60 mm. Moreover, although the inclination angle θ1 of the first wall portion 11511 and the inclination angle θ2 of the second wall portion 11512 are identically set at 100°, so long as they are equal, these inclination angles can be arbitrarily adjusted within the range of greater than 90° and 120° or less. Furthermore, although the height H2 of the first wall portion 11511 is 5 mm and the height H3 of the second wall portion 11512 is 3 mm; that is, a difference between them is 2 mm, the difference in height can be arbitrarily adjusted within the range of 1 mm to 4 mm. Correspondingly, the height H2 of the first wall portion 11511 and the height H3 of the second wall portion 11512 can be arbitrarily adjusted within the range of 1 mm to 5 mm, respectively, in order to produce the height difference. In addition, although, in this embodiment, the distance L4 is 27 mm and the distance L5 is 19.1 mm; that is, the distance L5 is shorter than the distance L4, so long as the distance L5 is shorter than the distance L4, the distance L4 and the distance L5 can be arbitrarily adjusted within the range of 12.5 mm to 30 mm, respectively.

Figure 13:
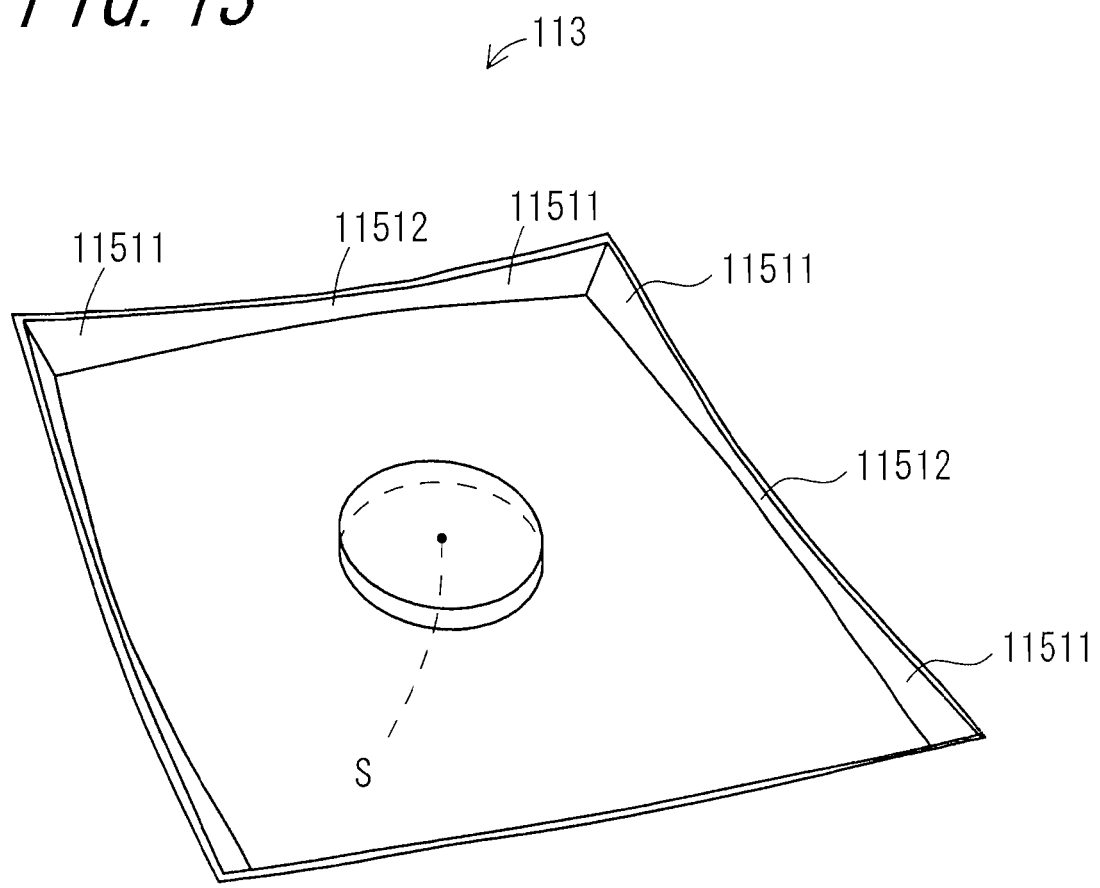
FIG. 13 is a view showing a modified example of a first embodiment.

In FIG. 13, there is shown a modified example of the first embodiment. In this modified example, the heights of the first wall portion 11511 and the second wall portion 11512 are individually varied continuously in proportion to the distance from the optical axis S, so that the minimum value of the height of the first wall portion 11511 is identical with the maximum value of the height of the second wall portion 11512. Accordingly, in this modified example, the first wall portion 11511 and the second wall portion 11512 are directly connected to each other without providing the connection portion 11513. However, the square outer shape of the reflective member 113 as viewed planarly in the X direction remains unchanged. Note that, in the modified example, the distance of each of the first wall portion 11511 and the second wall portion 11512 from the optical axis S refers to the distance between each portion's point of contact with the first reflecting surface 114a of the base portion 114 and the optical axis S, and, the height of each portion refers to the distance in the X direction from a point of contact between a straight line extending at the inclination angle θ1, θ2 from the portion's point of contact and the upper end face of the first, second wall portion 11511, 11512 to the first reflecting surface 114a of the base portion 114.

In the modified example, for example, the first wall portion 11511 can be configured so that its height becomes lower gradually with increasing proximity to the optical axis S, with the minimum value of the height set at 4 mm and the maximum value of the height set at 5 mm, and also the second wall portion 11512 can be configured so that its height becomes lower gradually with increasing proximity to the optical axis S, with the minimum value of the height set at 3 mm and the maximum value of the height set at 4 mm. In this way, where the heights of the first wall portion 11511 and the second wall portion 11512 are individually varied continuously, the uniformity of the quantity of illumination light can be enhanced.

Figure 9:
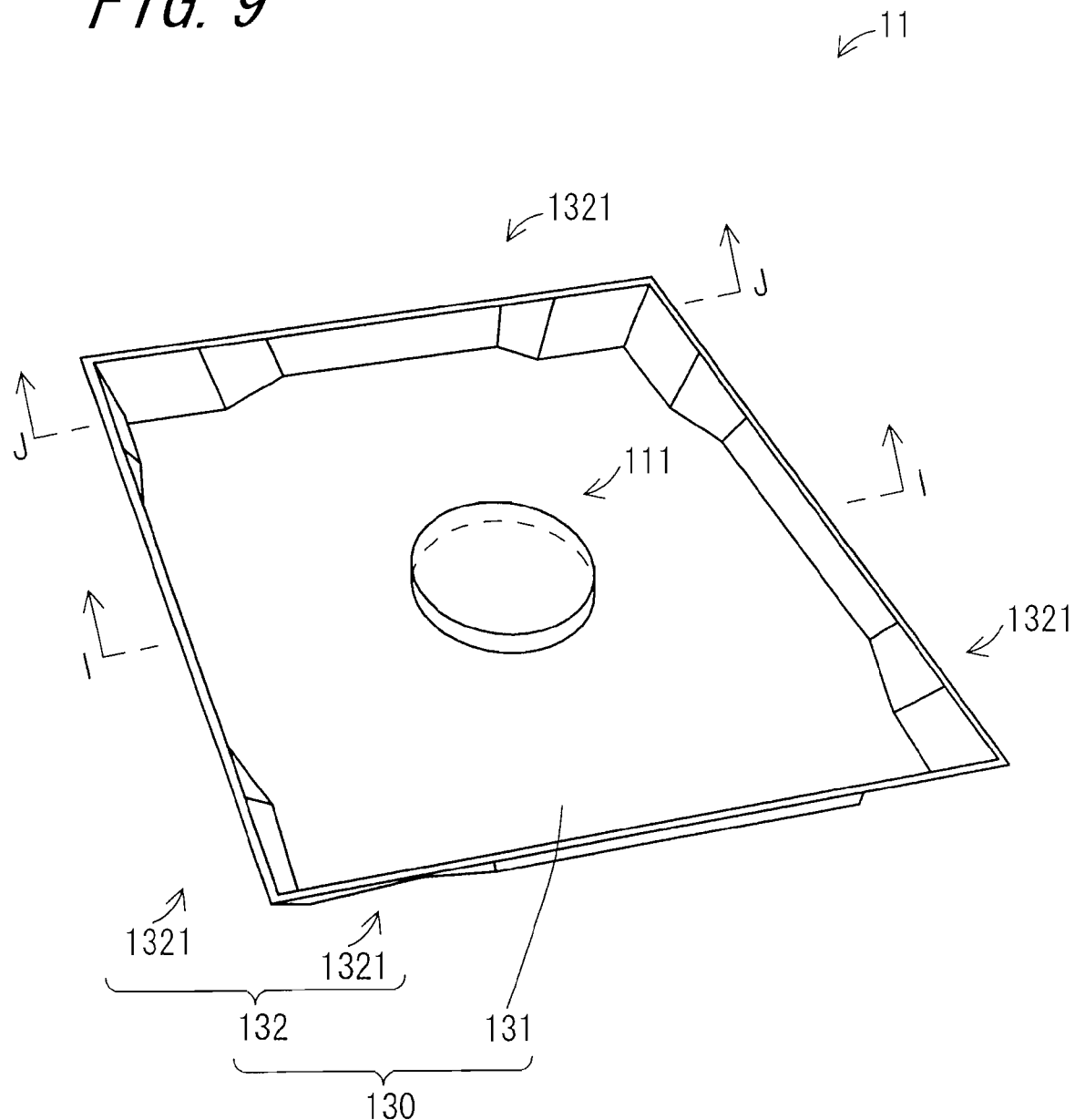
FIG. 9 is a view schematically showing outer appearance of a light-emitting device including a reflective member and a light-emitting section.
Figure 10A:
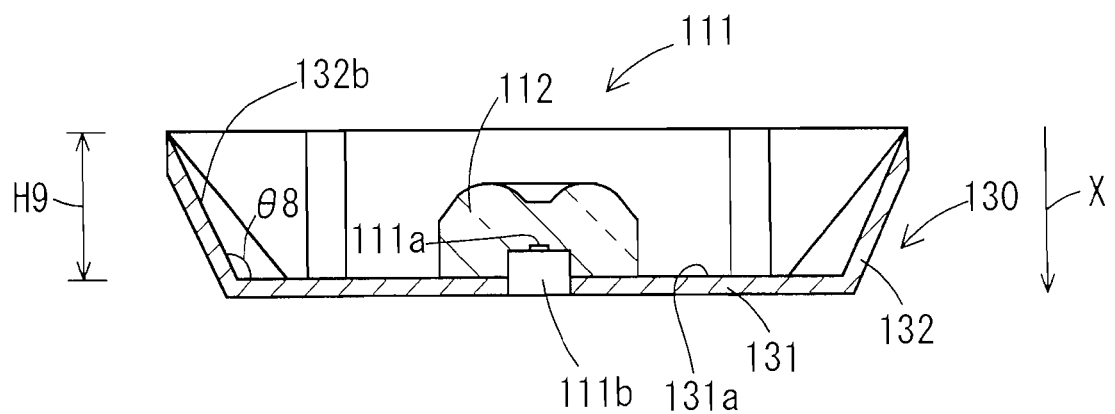
FIG. 10A is a sectional view of the light-emitting device including the reflective member and the light-emitting section.
Figure 10B:
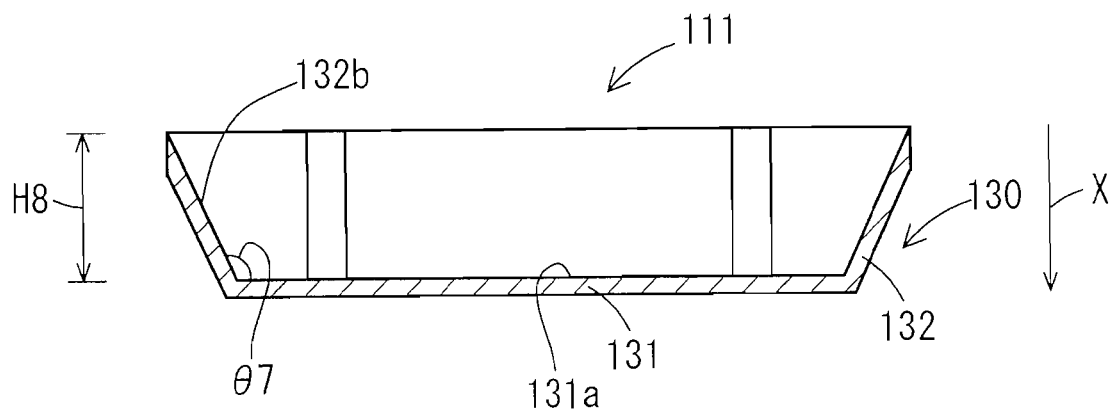
FIG. 10B is a sectional view of the light-emitting device including the reflective member and the light-emitting section.

Next, a second embodiment of the invention will be described. In the second embodiment, a reflective member 130 is provided in place of the reflective member 113, and otherwise the second embodiment is identical with the first embodiment, wherefore the description of constituent components other than the reflective member 130 will be omitted. FIG. 9 is a view schematically showing outer appearance of a light-emitting device 11 including the reflective member 130 and the light-emitting section 111. FIGS. 10A and 10B are sectional views of the light-emitting device 11 including the reflective member 130 and the light-emitting section 111, and more specifically, FIG. 10A schematically shows the section of the light-emitting device 11 taken along the line I-I of FIG. 9 and FIG. 10B schematically shows the section of the light-emitting device 11 taken along the line J-J of FIG. 9.

Figure 11:
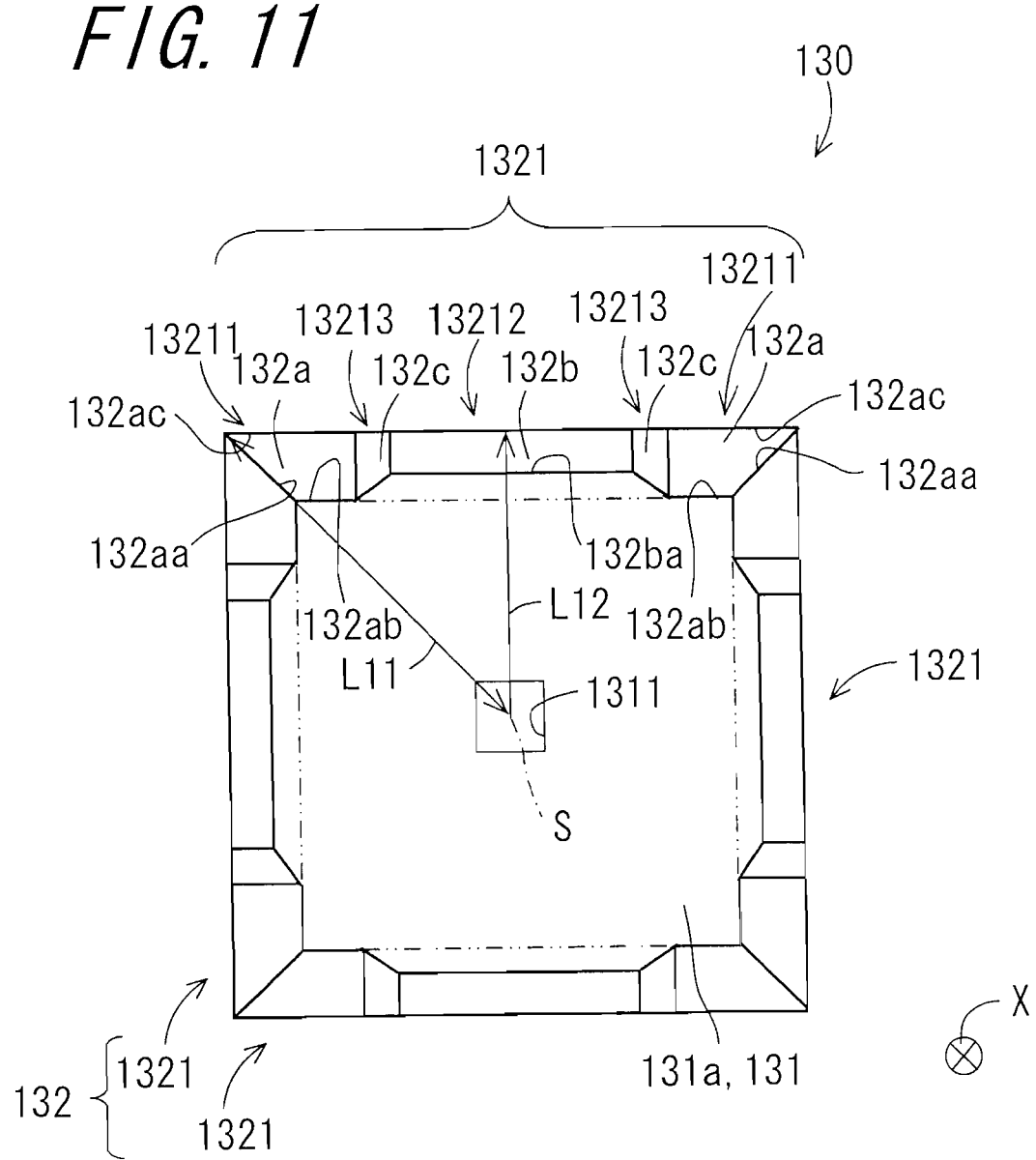
FIG. 11 is a view showing the reflective member as viewed planarly in an X direction.

FIG. 11 is a view showing the reflective member 130 as viewed planarly in the X direction. When viewed planarly in the X direction, the outer shape of the reflective member 130 is defined by a square which is 40 mm on a side. Each side of the square is parallel to the directions of rows or columns of the matrix arrangement of a plurality of LED chips 111a. In this embodiment, the reflective member 130 is configured linearly symmetrically with respect to the diagonal line of the square. Also, the reflective member 130 is configured rotationally symmetrically through 90° about the center point of the square. By way of another embodiment of the invention, the reflective member 130 may be configured to have a rectangular outer shape when viewed planarly in the X direction.

The reflective member 130 comprises a base portion 131 disposed on the mounting surface 12a of the printed substrate 12, and an inclined portion 132 which surrounds the outer edge of the base portion 131 while being connected to the outer edge. The base portion 131, which is an icosagonal flat plate-shaped member having a centrally-located opening 1311, includes a first reflecting surface 131a defined by a plane which is perpendicular to the X direction and faces the diffusion plate 3. The inclined portion 132, which is a frame-like member surrounding the light-emitting section 111, includes a second reflecting surface 132a, a third reflecting surface 132b, and a fourth reflecting surface 132c. The second reflecting surface 132a, the third reflecting surface 132b, and the fourth reflecting surface 132c are each a plane which faces the light-emitting section 111, and is inclined in a manner such that it gradually separates from the printed substrate 12 in a direction opposite to the X direction with decreasing proximity to the light-emitting section 111 in a direction perpendicular to the X direction.

In the base portion 131, the first reflecting surface 131a serves as its main surface, and the square opening 1311 is formed in the middle thereof as viewed planarly in the X direction. The length of one side of the square opening 1311 is substantially equal to the length L1 of one side of the base support 111b for supporting the LED chip 111a, so that the base support 111b is insertable through the opening 1311.

The first reflecting surface 131a of the base portion 131 has an icosagonal outer shape obtained by connecting an isosceles trapezoid to the central part of each side of a square shape. In this embodiment, the length of one side of the square shape is 38.2 mm, and, of two opposed parallel sides of the isosceles trapezoid, the longer one is disposed in entirely overlapping relation to the central part of each side of the square shape. Out of the two parallel sides of the isosceles trapezoid, the long side has a length of 22.2 mm, for example, whereas the short side has a length of 16 mm, for example, and, the distance between the long side and the short side is 0.46 mm, for example. Moreover, in this embodiment, each side of the square shape as above described is perpendicular or parallel to each side of the square defining the outer shape of the reflective member 130 as viewed planarly in the X direction.

The inclined portion 132 is a frame-like member constructed by connecting the ends of, respectively, four identically-shaped wall members 1321. Each of the wall members 1321 is composed of a first wall portion 13211 located at each end of the wall member 1321, a second wall portion 13212 located centrally of the wall member 1321, and a connection portion 13213 for connecting the first wall portion 13211 with the second wall portion 13212.

The first wall portion 13211, which is a flat plate-shaped member having the planar second reflecting surface 132a as a main surface, corresponds to the corner of the square defining the outer shape of the reflective member 130 as viewed planarly in the X direction. The second reflecting surface 132a is given a trapezoidal shape having two parallel sides, one side perpendicular to the two sides, and an oblique side 132aa opposed to the one side. The oblique side 132aa of the first wall portion 13211 is disposed in entirely overlapping relation to the oblique side 132aa of the first wall portion 13211 of other wall member 1321 than the wall member 1321 having the aforementioned first wall portion 13211.

Out of the two parallel sides of the trapezoidal second reflecting surface 132a, the shorter one, namely a short side 132ab is disposed in entirely overlapping relation to one side of the icosagonal first reflecting surface 131a. The length of the short side 132ab is set at 8 mm, for example. Moreover, of the two parallel sides of the trapezoidal second reflecting surface 132a, the longer one, namely a long side 132ac has a length of 8.9 mm, for example. A distance L11 from the optical axis S of the LED chip 111a to, of points lying on the long side 132ac, the point situated farthest from the optical axis S, is set at 27 mm, for example.

As shown in FIG. 10B, a height H8 of the second reflecting surface 132a with respect to the first reflecting surface 131a is set at 5 mm, for example. Moreover, as shown in FIG. 10B, an angle of inclination θ7 of the second reflecting surface 132a relative to the first reflecting surface 131a is set at 100°, for example.

The second wall portion 13212, which is a flat plate-shaped member having the planar third reflecting surface 132b as a main surface, corresponds to the side of the square defining the outer shape of the reflective member 130 as viewed planarly in the X direction. The third reflecting surface 132b is given a rectangular shape, one side 132ba of which is disposed in entirely overlapping relation to one side of the icosagonal first reflecting surface 131a. The length of the one side 132ba of the third reflecting surface 132b in overlapping relation to one side of the first reflecting surface 131a is set at 16 mm, for example. A distance L12 from the optical axis S of the LED chip 111a to, of points lying on that side of the rectangular third reflecting surface 132b opposed to the one side 132ba, the point situated closest to the optical axis S, is set at 19.1 mm, for example, which is shorter than the distance L11.

As shown in FIG. 10A, a height H9 of the third reflecting surface 132b with respect to the first reflecting surface 131a is set at 5 mm, for example, which is equal to the height H8. Moreover, as shown in FIG. 10A, an angle of inclination θ8 of the third reflecting surface 132b relative to the first reflecting surface 131a is set at 95°, for example, which is smaller than the inclination angle θ7.

The connection portion 13213 is a plate-like member having the fourth reflecting surface 132c as a main surface. The fourth reflecting surface 132c is continuous with one side of the icosagonal first reflecting surface 131a, one side of the trapezoidal second reflecting surface 132a, and one side of the rectangular third reflecting surface 132b. The fourth reflecting surface 132c is so shaped that its angle of inclination relative to the first reflecting surface 131a becomes smaller gradually from the second reflecting surface 132a-side to the third reflecting surface 132b-side. In this embodiment, the angle of inclination of the fourth reflecting surface 132c relative to the first reflecting surface 131a decreases gradually from 100° to 95° in a direction from the second reflecting surface 132a to the third reflecting surface 132b. As shown in FIG. 11, when the reflective member 130 is viewed in a direction parallel to the optical axis S, viz., the X direction, the upper end of the first wall portion 13211, the upper end of the second wall portion 13212, and the upper end of the connection portion 13213 lie on the same straight line. That is, so long as the reflective member 130 is viewed in a direction parallel to the optical axis S, viz., the X direction, the upper end of the first wall portion 13211 and the upper end of the second wall portion 13212 lie on the same straight line.

The base portion 131 and the inclined portion 132 are made of high-luminance PET, aluminum, or the like. The base portion 131 and the inclined portion 132 have a thickness in a range of 0.1 to 0.5 mm, for example.

In this embodiment, the first reflecting surface 131a of the base portion 131, as well as the second reflecting surface 132a, the third reflecting surface 132b, and the fourth reflecting surface 132c of the inclined portion 132, exhibits a total reflectivity of 94%. The total reflectivity of each of these surfaces is greater than or equal to 90%, or preferably 100%.

It is preferable that the base portion 131 and the inclined portion 132 constituting the reflective member 130 are formed integrally with each other, and also that the reflective members 130 provided respectively in the plural light-emitting devices 11 are formed integrally with each other. As the method of integrally forming a plurality of reflective members 130, where the reflective member 130 is made of foamed PET, extrusion molding can be adopted, and, where the reflective member 130 is made of aluminum, press working can be adopted.

In the reflective member 130 thusly constructed, as described previously, the distance L12 is shorter than the distance L11. That is, the second wall portion 13212 lies closer to the light-emitting section 111 than the first wall portion 13211. Moreover, the inclination angle θ8 of the second wall portion 13212 is smaller than the inclination angle θ7 of the first wall portion 13211. The advantageous effects of the invention produced by the reduction of the inclination angle θ8 of the second wall portion 13212 will be described with reference to FIGS. 8 and 12.

Figure 12:
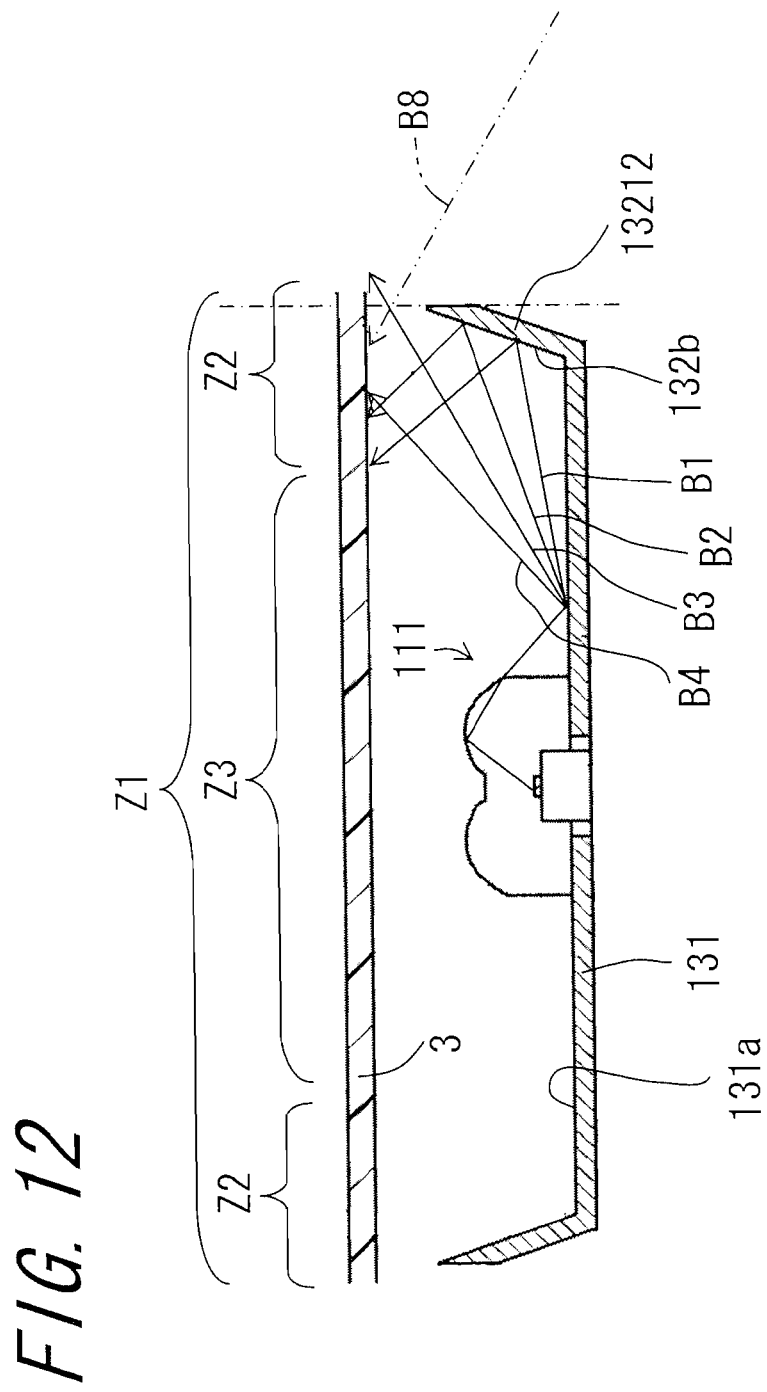
FIG. 12 is a view corresponding to FIG. 10A, illustrating advantageous effects of the invention.

FIG. 12, which shows the invention, corresponds to FIG. 10A. As shown in FIGS. 8 and 12, part of light emitted from the light-emitting section 111 travels toward the base portion 114, 131 of the reflective member 113, 130, and is then diffusely reflected from the first reflecting surface 114a, 131a of the base portion 114, 131. At this time, the reflected light resulting from the diffuse reflection, for example, like reflected light B1 to B4, travels in a plurality of directions.

In the example shown in FIG. 8, as has already been explained in the first embodiment, the reflected light B1, B2 is incident on the edge portion Z2 of the to-be-illuminated region Z1. In return for the reflected light B3, the reflected light B5 from another adjacent light-emitting device 11 is incident on the edge portion Z2 of the to-be-illuminated region Z1. The reflected light B4 is incident on the edge portion Z2 of the to-be-illuminated region Z1.

In the example shown in FIG. 12, in contrast to the example shown in FIG. 8, due to the fact that the second wall portion 13212 has the smaller inclination angle θ8, the angle of incidence and the angle of reflection of the reflected light B1, B2 relative to the third reflecting surface 132b of the second wall portion 13212 decrease, with the consequence that the reflected light B1, B2 is incident on the middle portion Z3 of the to-be-illuminated region Z1. The reflected light B3 passes through a region above the second wall portion 13212 to go out of the to-be-illuminated region Z1, and, in return, reflected light B8 from another adjacent light-emitting device 11 is incident on the edge portion Z2 of the to-be-illuminated region Z1. The reflected light B4 travels directly to enter the edge portion Z2 of the to-be-illuminated region Z1.

Accordingly, as compared with the example shown in FIG. 8 where the second wall portion 11514 is identical in inclination angle with the first wall portion 11511, in the example shown in FIG. 12 where the inclination angle θ8 of the second wall portion 13212 is smaller than the inclination angle θ7 of the first wall portion 13211, the quantity of light incident on a part of the edge portion Z2 of the to-be-illuminated region Z1 opposed to the second wall portion 13212 (a part thereof situated close to the second wall portion 13212) decreases. That is, it is possible to lessen the quantity of light applied to a part of the edge portion Z2 of the to-be-illuminated region Z1 opposed to the second wall portion 13212 (a part thereof situated close to the light-emitting section 111), and thereby render the quantity of light applied thereto uniform with the quantity of light applied to a part of the edge portion Z2 of the to-be-illuminated region Z1 opposed to the first wall portion 13211 (a part thereof situated away from the light-emitting section 111).

Although, in the second embodiment, the outer shape of the reflective member 130 as viewed planarly in the X direction is defined by a square which is 40 mm on a side, the length of one side of the square can be arbitrarily adjusted within the range of 20 mm to 60 mm. Moreover, although the height H8 of the first wall portion 13211 and the height H9 of the second wall portion 13212 are identically set at 5 mm, so long as they are equal, these heights can be arbitrarily adjusted within the range of 2 mm to 8 mm. Furthermore, although the inclination angle θ7 of the first wall portion 13211 is 100° and the inclination angle θ8 of the second wall portion 13212 is 95°; that is, a difference between them is 5°, the difference in inclination angle can be arbitrarily adjusted within the range of greater than 0° and 45° or less. Correspondingly, the inclination angle θ7 of the first wall portion 13211 and the inclination angle θ8 of the second wall portion 13212 can be arbitrarily adjusted within the range of greater than 90° and 120° or less, respectively, in order to produce the difference in inclination angle. In addition, although, in this embodiment, the distance L11 is 27 mm and the distance L12 is 19.1 mm; that is, the distance L12 is shorter than the distance L11, so long as the distance L12 is shorter than the distance L11, the distance L11 and the distance L12 can be arbitrarily adjusted within the range of 15 mm to 30 mm, respectively.

By way of a modified example of the second embodiment, a structure can be employed in which the inclination angles of the first wall portion 13211 and the second wall portion 13212 are individually varied continuously in proportion to the distance from the optical axis S, so that the minimum value of the inclination angle of the first wall portion 13211 is identical with the maximum value of the inclination angle of the second wall portion 13212. Accordingly, in this modified example, the first wall portion 13211 and the second wall portion 13212 are directly connected to each other without providing the connection portion 13213. However, the square outer shape of the reflective member 130 as viewed planarly in the X direction remains unchanged. Note that, in the modified example, the distance of each of the first wall portion 13211 and the second wall portion 13212 from the optical axis S refers to the distance between each portion's point of contact with the first reflecting surface 131a of the base portion 131 and the optical axis S.

In the modified example, for example, the first wall portion 13211 can be configured so that its inclination angle becomes smaller gradually with increasing proximity to the optical axis S, with the minimum value of the inclination angle set at 97.5° and the maximum value of the inclination angle set at 100°, and also the second wall portion 13212 can be configured so that its inclination angle becomes smaller gradually with increasing proximity to the optical axis S, with the minimum value of the inclination angle set at 95° and the maximum value of the inclination angle set at 97.5°. In this way, where the inclination angles of the first wall portion 13211 and the second wall portion 13212 are individually varied continuously, the uniformity of the quantity of illumination light can be enhanced.

Figure 14:
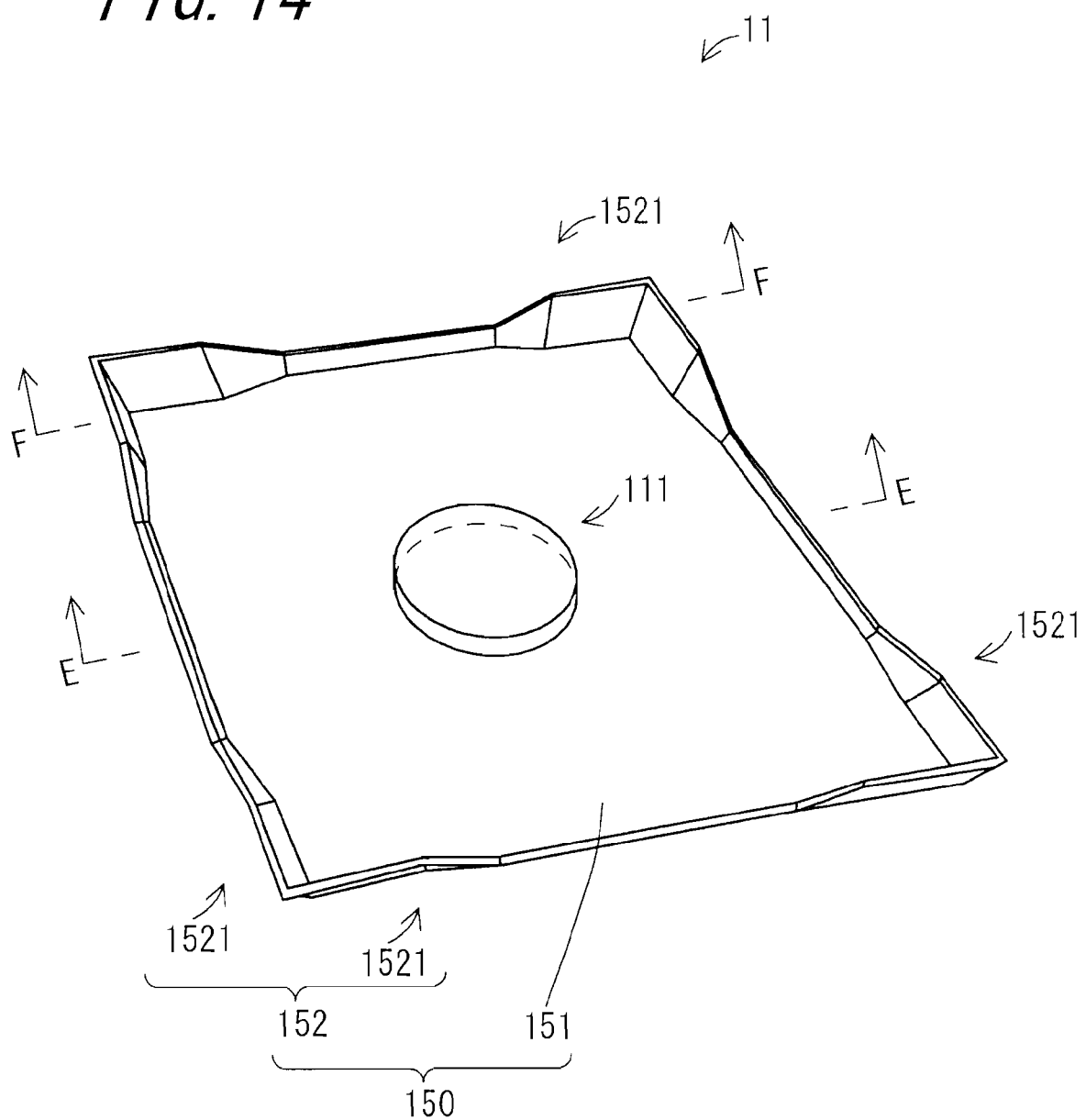
FIG. 14 is a view schematically showing outer appearance of a light-emitting device including a reflective member and a light-emitting section.
Figure 15A:
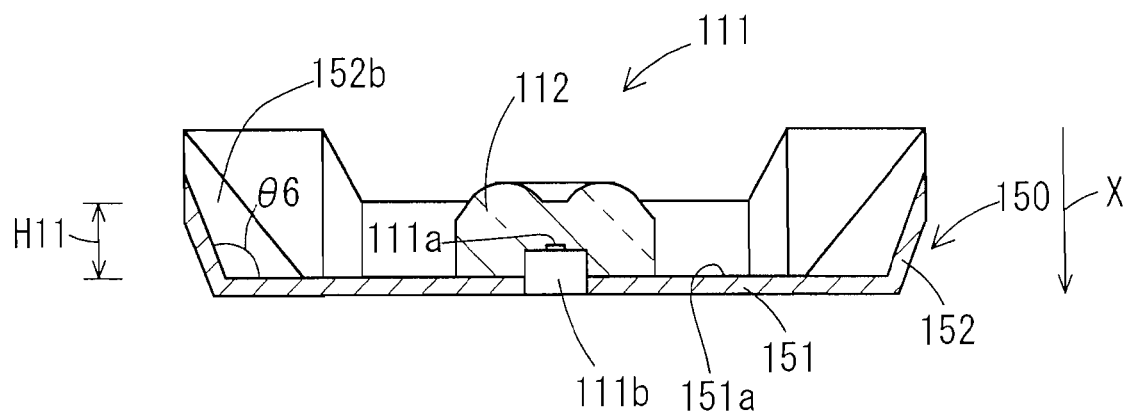
FIG. 15A is a sectional view of the light-emitting device including the reflective member and the light-emitting section.
Figure 15B:
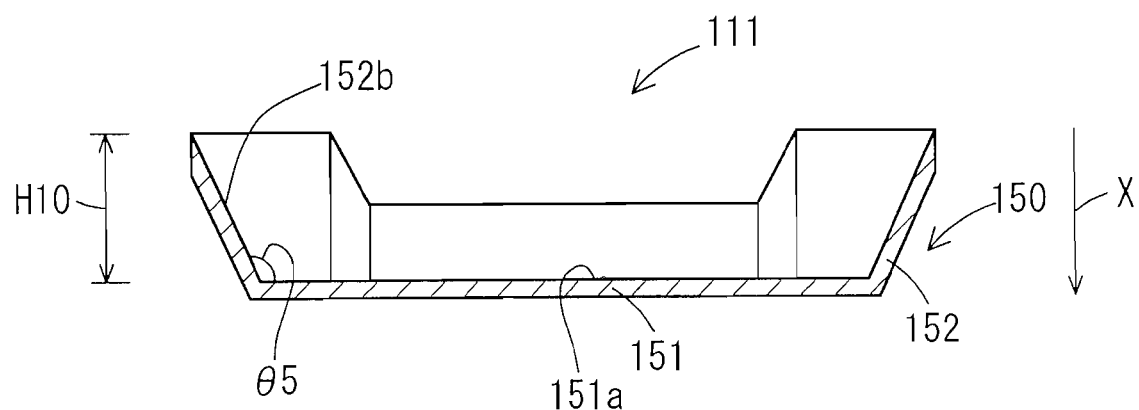
FIG. 15B is a sectional view of the light-emitting device including the reflective member and the light-emitting section.

Next, a third embodiment of the invention will be described. In the third embodiment, a reflective member 150 is provided in place of the reflective member 113, and otherwise the third embodiment is identical with the first embodiment, wherefore the description of constituent components other than the reflective member 150 will be omitted. FIG. 14 is a view schematically showing the outer appearance of a light-emitting device 11 including the reflective member 150 and the light-emitting section 111. FIGS. 15A and 15B are sectional views of the light-emitting device 11 including the reflective member 150 and the light-emitting section 111, and more specifically, FIG. 15A schematically shows the section of the light-emitting device 11 taken along the line E-E of FIG. 14 and FIG. 15B schematically shows the section of the light-emitting device 11 taken along the line F-F of FIG. 14.

Figure 16:
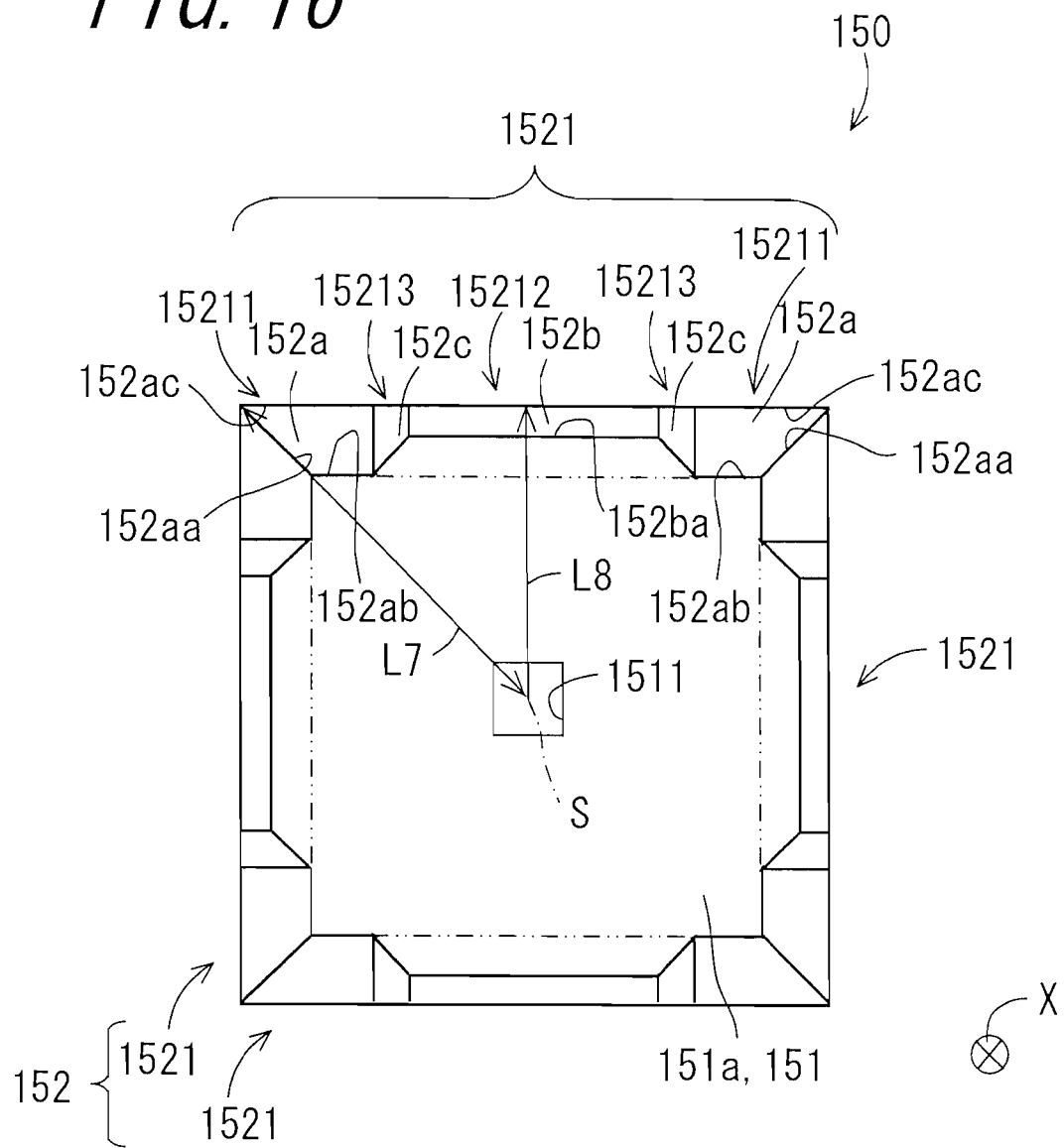
FIG. 16 is a view showing the reflective member as viewed planarly in an X direction.

FIG. 16 is a view showing the reflective member 150 as viewed planarly in the X direction. When viewed planarly in the X direction, the outer shape of the reflective member 150 is defined by a square which is 40 mm on a side. Each side of the square is parallel to the directions of rows or columns of the matrix arrangement of a plurality of LED chips 111a. In this embodiment, the reflective member 150 is configured linearly symmetrically with respect to the diagonal line of the square. Also, the reflective member 150 is configured rotationally symmetrically through 90° about the center point of the square. By way of another embodiment of the invention, the reflective member 150 may be configured to have a rectangular outer shape when viewed planarly in the X direction.

The reflective member 150 comprises a base portion 151 disposed on the mounting surface 12a of the printed substrate 12, and an inclined portion 152 which surrounds the outer edge of the base portion 151 while being connected to the outer edge. The base portion 151, which is an icosagonal flat plate-shaped member having a centrally-located opening 1511, includes a first reflecting surface 151a defined by a plane which is perpendicular to the X direction and faces the diffusion plate 3. The inclined portion 152, which is a frame-like member surrounding the light-emitting section 111, includes a second reflecting surface 152a, a third reflecting surface 152b, and a fourth reflecting surface 152c. The second reflecting surface 152a, the third reflecting surface 152b, and the fourth reflecting surface 152c are each a plane which faces the light-emitting section 111, and is inclined in a manner such that it gradually separates from the printed substrate 12 in a direction opposite to the X direction with decreasing proximity to the light-emitting section 111 in a direction perpendicular to the X direction.

In the base portion 151, the first reflecting surface 151a serves as its main surface, and the square opening 1511 is formed in the middle thereof as viewed planarly in the X direction. The length of one side of the square opening 1511 is substantially equal to the length L1 of one side of the base support 111b for supporting the LED chip 111a, so that the base support 111b is insertable through the opening 1511.

The first reflecting surface 151a of the base portion 131 has an icosagonal outer shape obtained by connecting an isosceles trapezoid to the central part of each side of a square shape. In this embodiment, of two opposed parallel sides of the isosceles trapezoid, the longer one is disposed in entirely overlapping relation to the central part of each side of the square shape. Moreover, in this embodiment, each side of the square shape as above described is perpendicular or parallel to each side of the square defining the outer shape of the reflective member 150 as viewed planarly in the X direction.

The inclined portion 152 is a frame-like member constructed by connecting the ends of, respectively, four identically-shaped wall members 1521. Each of the wall members 1521 is composed of a first wall portion 15211 located at each end of the wall member 1521, a second wall portion 15212 located centrally of the wall member 1521, and a connection portion 15213 for connecting the first wall portion 15211 with the second wall portion 15212.

The first wall portion 15211, which is a flat plate-shaped member having the planar second reflecting surface 152a as a main surface, corresponds to the corner of the square defining the outer shape of the reflective member 150 as viewed planarly in the X direction. The second reflecting surface 152a is given a trapezoidal shape having two parallel sides, one side perpendicular to the two sides, and an oblique side 152aa opposed to the one side. The oblique side 152aa of the first wall portion 15211 is disposed in entirely overlapping relation to the oblique side 152aa of the first wall portion 15211 of other wall member 1521 than the wall member 1521 having the aforementioned first wall portion 15211.

Out of the two parallel sides of the trapezoidal second reflecting surface 152a, the shorter one, namely a short side 152ab is disposed in entirely overlapping relation to one side of the icosagonal first reflecting surface 151a. Moreover, a distance L7 from the optical axis S of the LED chip 111a to, of points lying on a long side 152ac which is the longer one of the two parallel sides of the trapezoidal second reflecting surface 152a, the point situated farthest from the optical axis S, is set at 27 mm, for example.

As shown in FIG. 15B, a height H10 of the second reflecting surface 152a with respect to the first reflecting surface 151a is set at 5 mm, for example. Moreover, as shown in FIG. 15B, an angle of inclination θ5 of the second reflecting surface 132a relative to the first reflecting surface 151a is set at 100°, for example.

The second wall portion 15212, which is a flat plate-shaped member having the planar third reflecting surface 152b as a main surface, corresponds to the side of the square defining the outer shape of the reflective member 150 as viewed planarly in the X direction. The third reflecting surface 152b is given a rectangular shape, one side 152ba of which is disposed in entirely overlapping relation to one side of the icosagonal first reflecting surface 131a. A distance L8 from the optical axis S of the LED chip 111a to, of points lying on that side of the rectangular third reflecting surface 132b opposed to the one side 132ba, the point situated closest to the optical axis S, is set at 19.1 mm, for example, which is shorter than the distance L7.

As shown in FIG. 15A, a height H11 of the third reflecting surface 152b with respect to the first reflecting surface 151a is set at 3 mm, for example, which is lower than the height H10. Moreover, as shown in FIG. 15A, an angle of inclination θ6 of the third reflecting surface 152b relative to the first reflecting surface 151a is set at 95°, for example, which is smaller than the inclination angle θ5.

The connection portion 15213 is a plate-like member having the fourth reflecting surface 152c as a main surface. The fourth reflecting surface 152c is continuous with one side of the icosagonal first reflecting surface 151a, one side of the trapezoidal second reflecting surface 152a, and one side of the rectangular third reflecting surface 152b. The fourth reflecting surface 152c is so shaped that its angle of inclination relative to the first reflecting surface 151a becomes smaller gradually from the second reflecting surface 152a-side to the third reflecting surface 152b-side. In this embodiment, the angle of inclination of the fourth reflecting surface 152c relative to the first reflecting surface 151a decreases gradually from 100° to 95° in a direction from the second reflecting surface 152a to the third reflecting surface 152b. As shown in FIG. 16, when the reflective member 150 is viewed in a direction parallel to the optical axis S, viz., the X direction, the upper end of the first wall portion 15211, the upper end of the second wall portion 15212, and the upper end of the connection portion 15213 lie on the same straight line. That is, so long as the reflective member 150 is viewed in a direction parallel to the optical axis S, viz., the X direction, the upper end of the first wall portion 15211 and the upper end of the second wall portion 15212 lie on the same straight line.

The base portion 151 and the inclined portion 152 are made of high-luminance PET, aluminum, or the like. The base portion 151 and the inclined portion 152 have a thickness in a range of 0.1 to 0.5 mm, for example.

In this embodiment, the first reflecting surface 151a of the base portion 151, as well as the second reflecting surface 152a, the third reflecting surface 152b, and the fourth reflecting surface 152c of the inclined portion 152, exhibits a total reflectivity of 94%. The total reflectivity of each of these surfaces is greater than or equal to 90%, or preferably 100%.

It is preferable that the base portion 151 and the inclined portion 152 constituting the reflective member 150 are formed integral with each other, and also that the reflective members 150 provided respectively in the plurality of light-emitting devices 11 are formed integrally with each other. As the method of integrally forming a plurality of reflective members 150, where the reflective member 150 is made of foamed PET, extrusion molding can be adopted, and, where the reflective member 150 is made of aluminum, press working can be adopted.

Although, in the third embodiment, the outer shape of the reflective member 150 as viewed planarly in the X direction is defined by a square which is 40 mm on a side, the length of one side of the square can be arbitrarily adjusted within the range of 20 mm to 60 mm. Moreover, although the height H10 of the first wall portion 15211 is 5 mm and the height H11 of the second wall portion 15212 is 3 mm; that is, a difference between them is 2 mm, the difference in height can be arbitrarily adjusted within the range of 1 mm to 4 mm. Furthermore, although the inclination angle θ5 of the first wall portion 15211 is 100° and the inclination angle θ6 of the second wall portion 15212 is 95°; that is, a difference between them is 5°, the difference in inclination angle can be arbitrarily adjusted within the range of greater than 0° and 45° or less.

Correspondingly, the inclination angle θ5 of the first wall portion 15211 and the inclination angle θ6 of the second wall portion 15212 can be arbitrarily adjusted within the range of greater than 90° and 120° or less, respectively, in order to produce the difference in inclination angle. In addition, although, in this embodiment, the distance L7 is 27 mm and the distance L8 is 19.1 mm; that is, the distance L8 is shorter than the distance L7, so long as the distance L8 is shorter than the distance L7, the distance L7 and the distance L8 can be arbitrarily adjusted within the range of 15 mm to 30 mm, respectively.

According to the liquid-crystal display apparatus 100 having the backlight unit 1 as in the first to third embodiments, by virtue of the backlight unit 1, light can be applied to the diffusion plate 3, which is the to-be-illuminated object, with uniformity in light intensity in the planar direction, wherefore the liquid-crystal panel 2 disposed in parallel with the diffusion plate 3 can be irradiated with light with uniformity in light intensity in the planar direction. This allows the liquid-crystal display apparatus 100 to perform display of high-quality images.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

REFERENCE SIGNS LIST

1: Backlight unit
2: Liquid-crystal panel
12: Printed substrate
12*a*: Mounting surface
100: Liquid-crystal display apparatus
111*a*: LED chip
111*b*: Base support
112: Lens
112*a*: Top surface
112*b*: Side surface
113, 130, 150: Reflective member
114, 131, 151: Base portion
115, 132, 152: Inclined portion
11511, 13211, 15211: First wall portion
11512, 13212, 15212: Second wall portion

The invention claimed is:

1. A light-emitting device for applying light to an object to be illuminated, comprising:
a light-emitting section for emitting light; and
a reflective member disposed around the light-emitting section, the reflective member having a base portion extending in a direction perpendicular to an optical axis of the light-emitting section, and an inclined portion extending with inclination from the base portion, the inclined portion including a first wall portion and a second wall portion which is lower in height from the base portion than the first wall portion, and is shorter in distance from the light-emitting section than the first wall portion.

2. The light-emitting device according to claim 1,
wherein the first wall portion is disposed at a corner of the reflective member.

3. The light-emitting device according to claim 1,
wherein, when the reflective member is viewed in a direction parallel to the optical axis, an upper end of the first wall portion and an upper end of the second wall portion lie on the same straight line.

4. The light-emitting device according to claim 3,
wherein the first wall portion and the second wall portion are continuously connected to each other.

5. An illuminating apparatus comprising:
a plurality of the light-emitting devices according to claim 1, the plurality of the light-emitting devices being disposed to align.

6. A display apparatus comprising:
a display panel; and
the illuminating apparatus according to claim 5.

7. A display apparatus comprising:
a display panel; and
an illuminating apparatus that applies light to the display panel from a back side thereof, the illuminating apparatus including the light-emitting device according to claim 1.

8. A light-emitting device for applying light to an object to be illuminated, comprising:
a light-emitting section for emitting light; and
a reflective member disposed around the light-emitting section, the reflective member having a base portion extending in a direction perpendicular to an optical axis of the light-emitting section, and an inclined portion extending with inclination from the base portion, the inclined portion including a first wall portion and a second wall portion which is smaller in angle of inclination relative to the base portion than the first wall portion, and is shorter in distance from the light-emitting section than the first wall portion.

9. The light-emitting device according to claim 8,
wherein the first wall portion is disposed at a corner of the reflective member.

10. The light-emitting device according to claim 8,
wherein, when the reflective member is viewed in a direction parallel to the optical axis, an upper end of the first wall portion and an upper end of the second wall portion lie on the same straight line.

11. The light-emitting device according to claim 10,
wherein the first wall portion and the second wall portion are continuously connected to each other.

12. An illuminating apparatus comprising:
a plurality of the light-emitting devices according to claim 8, the plurality of the light-emitting devices being disposed to align.

13. A display apparatus comprising:
a display panel; and
the illuminating apparatus according to claim 12.

14. A display apparatus comprising:
a display panel; and
an illuminating apparatus that applies light to the display panel from a back side thereof, the illuminating apparatus including the light-emitting device according to claim 8.

15. A light-emitting device for applying light to an object to be illuminated, comprising:
a light-emitting section for emitting light; and
a reflective member disposed around the light-emitting section, the reflective member having a base portion extending in a direction perpendicular to an optical axis of the light-emitting section, and an inclined portion extending with inclination from the base portion, the inclined portion including a first wall portion and a second wall portion which is lower in height from the base portion than the first wall portion, is smaller in angle of inclination relative to the base portion than the first wall portion, and is shorter in distance from the light-emitting section than the first wall portion.

16. The light-emitting device according to claim 15, wherein the first wall portion is disposed at a corner of the reflective member.

17. The light-emitting device according to claim 15, wherein, when the reflective member is viewed in a direction parallel to the optical axis, an upper end of the first wall portion and an upper end of the second wall portion lie on the same straight line.

18. The light-emitting device according to claim 17, wherein the first wall portion and the second wall portion are continuously connected to each other.

19. An illuminating apparatus comprising:
a plurality of the light-emitting devices according to claim 15, the plurality of the light-emitting devices being disposed to align.

20. A display apparatus comprising:
a display panel; and
the illuminating apparatus according to claim 19.

21. A display apparatus comprising:
a display panel; and
an illuminating apparatus that applies light to the display panel from a back side thereof, the illuminating apparatus including the light-emitting device according to claim 15.

* * * * *